United States Patent
Fritchman et al.

(10) Patent No.: US 11,022,503 B2
(45) Date of Patent: Jun. 1, 2021

(54) REFERENCE CIRCUIT FOR METROLOGY SYSTEM

(71) Applicant: Apple Inc., Cupertino, CA (US)

(72) Inventors: Daniel J. Fritchman, San Francisco, CA (US); Jafar Savoj, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/735,600

(22) Filed: Jan. 6, 2020

(65) Prior Publication Data

US 2020/0217729 A1 Jul. 9, 2020

Related U.S. Application Data

(63) Continuation of application No. 15/272,941, filed on Sep. 22, 2016, now Pat. No. 10,527,503.

(Continued)

(51) Int. Cl.
*G01K 17/00* (2006.01)
*G01K 7/20* (2006.01)
(Continued)

(52) U.S. Cl.
CPC .............. *G01K 17/00* (2013.01); *G01K 7/203* (2013.01); *G01K 15/005* (2013.01); *G01R 19/0084* (2013.01); *G01R 31/2644* (2013.01)

(58) Field of Classification Search
CPC ........ G01K 7/203; G01K 17/00; G01K 15/00; G01K 15/002; G01K 15/005; G01R 19/0084; G01R 31/2644
See application file for complete search history.

(56) References Cited

U.S. PATENT DOCUMENTS

| | | |
|---|---|---|
| 4,643,586 A | 2/1987 | Hansen |
| 5,180,995 A | 1/1993 | Hayashi et al. |
| (Continued) | | |

FOREIGN PATENT DOCUMENTS

| | | |
|---|---|---|
| CN | 1721965 A | 1/2006 |
| CN | 193410 A | 3/2007 |
| (Continued) | | |

OTHER PUBLICATIONS

Office Action in Japanese Appl. No. 2018-553864 dated July 123, 2019, 5 pages.

(Continued)

*Primary Examiner* — Natalie Huls
(74) *Attorney, Agent, or Firm* — Kowert, Hood, Munyon, Rankin & Goetzel, P.C.; Erik A. Heter

(57) ABSTRACT

Reference center circuitry for a metrology system is disclosed. In one embodiment, the circuitry includes a reference sensor having a topology and characteristics identical to a number of sensors throughout an IC. The both the reference sensor and the sensors on the IC may be used to perform voltage and temperature measurements. The reference sensor may receive a voltage from a precision voltage supply, and may be used as a sensor to provide a basis for calibrating the other sensors, as well. Thereafter, temperature readings obtained from the other sensors may be correlated to the readings obtained by the reference sensor for enhanced accuracy. The reference center circuitry also includes analog process monitoring circuitry, which may be coupled to some, if not all of the transistors implemented on an IC.

20 Claims, 15 Drawing Sheets

Related U.S. Application Data

(60) Provisional application No. 62/276,635, filed on Jan. 8, 2016.

(51) Int. Cl.
*G01R 31/26* (2020.01)
*G01K 15/00* (2006.01)
*G01R 19/00* (2006.01)

(56) References Cited

U.S. PATENT DOCUMENTS

| | | | |
|---|---|---|---|
| 5,349,311 | A | 9/1994 | Mentzer |
| 5,994,970 | A | 11/1999 | Cole et al. |
| 7,209,013 | B2 | 4/2007 | Norman |
| 7,594,149 | B2 | 9/2009 | Pilling |
| 7,891,865 | B2 | 2/2011 | Clark |
| 8,183,910 | B2 | 5/2012 | Chung |
| 8,310,265 | B2 | 11/2012 | Zjajo |
| 8,437,720 | B2 | 5/2013 | Burns |
| 8,589,100 | B2 | 11/2013 | Chaji |
| 8,786,237 | B2 | 7/2014 | Sato |
| 9,176,089 | B2 | 11/2015 | Le Neel |
| 10,459,478 | B1 * | 10/2019 | Savoj .................. G01R 19/165 |
| 2002/0181543 | A1 | 12/2002 | Yin |
| 2003/0156622 | A1 | 8/2003 | Gold et al. |
| 2004/0135643 | A1 | 7/2004 | Clabes et al. |
| 2006/0238267 | A1 | 10/2006 | Bienek |
| 2007/0081575 | A1 * | 4/2007 | Liu ........................ G01K 7/203 374/111 |
| 2008/0151966 | A1 | 6/2008 | Clark et al. |
| 2008/1743350 | | 7/2008 | Maekawa |
| 2009/0063070 | A1 | 3/2009 | Renneberg |
| 2009/0285261 | A1 | 11/2009 | Casey et al. |
| 2010/0073068 | A1 | 3/2010 | Cho et al. |
| 2010/0231252 | A1 | 9/2010 | Goel |
| 2010/0316086 | A1 | 12/2010 | Engelstad et al. |
| 2011/0301909 | A1 | 12/2011 | Jackson et al. |
| 2012/0110352 | A1 | 5/2012 | Branover et al. |
| 2013/0076381 | A1 | 3/2013 | Takayanagi et al. |
| 2014/0140364 | A1 | 5/2014 | Charles et al. |
| 2014/0159801 | A1 * | 6/2014 | Flores ................... G06F 1/3296 327/513 |
| 2015/0022177 | A1 | 1/2015 | Petrovic et al. |
| 2015/0117486 | A1 | 4/2015 | Yang |
| 2016/0097805 | A1 | 4/2016 | Yeh |
| 2017/0089975 | A1 | 3/2017 | Savoj et al. |
| 2018/0080837 | A1 | 3/2018 | Brunner et al. |
| 2018/0283964 | A1 | 10/2018 | Turullols et al. |

FOREIGN PATENT DOCUMENTS

| | | |
|---|---|---|
| CN | 201536362 U | 7/2010 |
| CN | 103441760 A | 12/2013 |
| CN | 204831597 U | 12/2015 |
| JP | 2004-219410 A | 8/2004 |
| JP | 2008-545120 T | 12/2008 |
| JP | 2010-091443 A | 4/2010 |
| JP | 2015-195393 A | 11/2015 |
| WO | 2011/115038 | 9/2011 |

OTHER PUBLICATIONS

International Preliminary Report in Appl. No. PCT/US2017/012198 dated Jul. 10, 2018, 7 pages.
International Search Report and Written Opinion in Appl. No. PCT/US2017/012198 dated Mar. 17, 2017, 13 pages.
Office Action in CN Appl. No. 201780005894.5 dated Mar. 23, 2020, 9 pages.
Lin Rong et al., "Design of New Low-Power Consumption on-Chip CMOS Temperature Sensor," Chinese Journal of Sensors and Actuators, vol. 24, No. 7, Jul. 2011, 5 pages.
Kim et al., "Adaptive-Bandwidth Phase-Locked Loop With Continuous Background Frequency Calibration," IEEE Transactions on Circuits and Systems—II: Express Briefs, vol. 56, No. 3, Mar. 2009, pp. 205-209.
Notice of Allowance in CN Appl. No. 201780005894.5 dated Mar. 31, 2021, 4 pages.
Office Action in Indian Appl. No. 201817028837 dated Apr. 5, 2021, 5 pages.

* cited by examiner

REFERENCE CIRCUIT FOR METROLOGY SYSTEM

BACKGROUND

Priority Information

This application is a continuation of U.S. application Ser. No. 15/272,941, filed Sep. 22, 2016 (now U.S. Pat. No. 10,527,503), which claims priority to U.S. Provisional Appl No. 62/276,635, filed Jan. 8, 2016; the disclosures of each of the above-referenced applications are incorporated by reference herein in their entireties.

Technical Field

This disclosure is directed to integrated circuits, and more particularly, to a reference circuit for a metrology system used monitoring parameters such as temperature and voltage during the operation of an integrated circuit.

Description of the Related Art

As features sizes have decreased, the number of transistors on integrated circuits (ICs) has correspondingly increased. The increased number of transistors per unit area has resulted in a corresponding increase in thermal output of ICs. Furthermore, the increased number of transistors per unit area has also corresponded to a decrease in the supply voltages provided to various functional circuitry on an IC. This has in turn led to significant challenges in balancing performance, power consumption, and thermal output of ICs. To this end, many ICs implement subsystems that monitor various metrics of the IC (e.g., temperature, voltage, voltage droops) and adjust the performance based on received measurements. For example, a control subsystem may reduce a clock frequency, supply voltage, or both, responsive to a temperature reading that exceeds a predefined threshold. This may help maintain operation of the IC within specified thermal limits. Such control systems may also boost the performance of certain functional circuits when measured metrics are well within limits.

IC subsystems used to control performance based on system metrics typically include one or more sensors and at least one control system. Due to factors such as process, voltage, and temperature variations, at least some of the sensors of such a subsystem may be coupled to receive power from a supply different from that used to power functional circuitry in the IC.

SUMMARY

Reference center circuitry for a metrology system is disclosed. In one embodiment, the circuitry includes a reference sensor having a topology and characteristics identical to a number of sensors throughout an IC. The both the reference sensor and the sensors on the IC may be used to perform voltage and temperature measurements. The reference sensor may receive a voltage from a precision voltage supply, and may be used as a sensor to provide a basis for calibrating the other sensors, as well. Thereafter, temperature readings obtained from the other sensors may be correlated to the readings obtained by the reference sensor for enhanced accuracy. The reference center circuitry also includes analog process monitoring circuitry, which may be coupled to some, if not all of the transistors implemented on an IC. The analog process monitoring circuitry may provide a mechanism for characterization of the analog characteristics of transistors on the IC. An analog test center may provide a hub for extracting and digitizing signals from a reference temperature sensor (separate from, but used in conjunction with, the above-mentioned reference sensor), the analog process monitor, and other analog measurement signals received via an analog bus. The resulting digital information can be provided to other circuitry, on chip or off, for post processing and analysis.

In one embodiment, the reference sensor is associated with a precision voltage supply and a precision temperature sensor. The reference sensor, as well as the other sensors, may be implemented with ring oscillators. In one embodiment, each of the sensors includes two ring oscillators having different characteristics from one another. Based the respective frequencies produced by the ring oscillators, the sensed voltage and temperatures may be solved for based on characteristic polynomials derived during calibration procedures. The reference sensor may receive a precise input voltage, and is located in close proximity to the reference temperature sensor. Accordingly, known values of temperature and voltage may be input into the reference sensor, and the corresponding characteristic polynomial may be generated thereupon. Since the reference sensor has the same topology and substantially the same characteristics as the other sensors, readings received therefrom may be correlated to the reference sensor characteristics. The temperature and voltage inputs to the reference sensor may be digitized by a high accuracy analog to digital converter arranged to operate at low speed and with high resolution. For additional accuracy, automated test equipment may be used to calibrate the reference temperature and input voltage to the reference sensor. The digitizing of the data from the reference voltage, the reference temperature, and the readings from the reference sensor may be used to perform digital correction of analog non-linearities.

BRIEF DESCRIPTION OF THE DRAWINGS

The following detailed description makes reference to the accompanying drawings, which are now briefly described.

Figure 1:
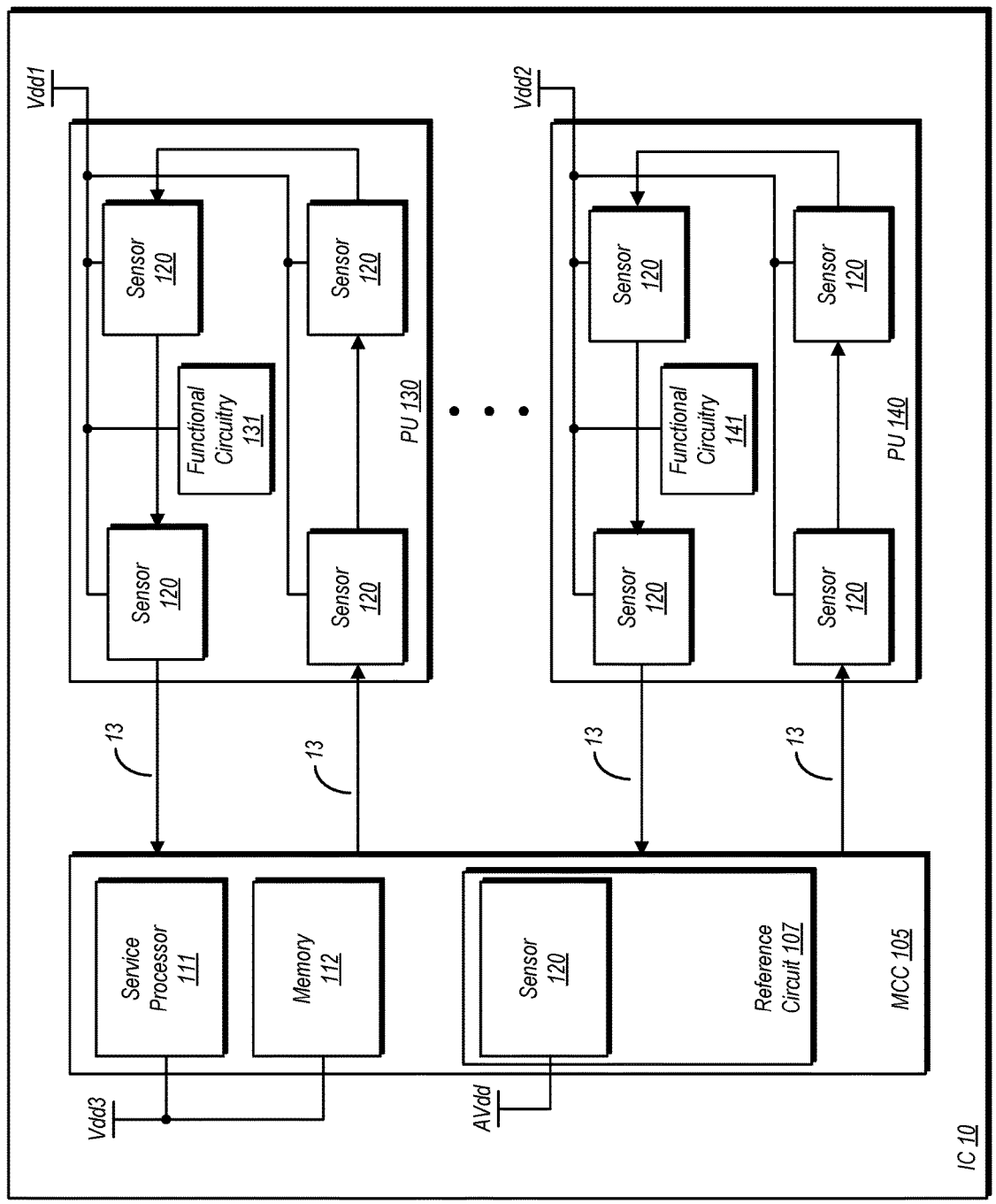
FIG. 1 is a block diagram of one embodiment of an IC.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) (or pre-AIA paragraph six) interpretation for that unit/circuit/component.

DETAILED DESCRIPTION OF EMBODIMENTS

Turning now to FIG. 1, a block diagram of one embodiment of an IC is shown. In the embodiment shown, IC 10 includes two functional circuit blocks, processing unit (PU) 130, and PU 140. In various embodiments, other functional circuit blocks may be included, including additional instances of PU 130. PU 130 and PU 140 are thus shown here as exemplary functional circuit blocks, but are not intended to limit the scope of this disclosure. Each of PU 130 and 140 may be a general purpose processor core, a graphics processing unit, a digital signal processing unit, or virtually any other kind of functional unit configured to perform a processing function. The scope of this disclosure may apply to any of these types of functional circuit blocks, as well as other not explicitly mentioned herein. The number of functional circuit blocks shown here is exemplary as well, as the disclosure is not limited to any particular number.

PU 130 in the embodiment shown is a general purpose processor core configured to execute the instructions of an instruction set and perform general purpose processing operations. Functional circuitry 131 of PU 130 may thus include various types of circuitry such as execution units of various types (integer, floating point, etc.), register files, schedulers, instruction fetch units, various levels of cache memory, and other circuitry that may be implemented in a processor core. PU 130, and all circuitry therein, is coupled to receive supply voltage Vdd1 in this embodiment. It is noted however that multiple power domains, and thus multiple supply voltages, may be implemented within various embodiments of PU 130. Furthermore, supply voltages provided to PU 130 may be variable under the control of power management circuitry (not shown). The power management circuitry adjusts the voltages for various reasons, such as controlling performance levels, thermal output, and power consumption.

GPU 140 in the illustrated embodiment includes functional circuitry 141, which may implement various types of graphics processing circuitry. This may include graphics processing cores, various types of memory and registers, and so on. GPU 140 in the embodiment shown is coupled to receive a second supply voltage, Vdd2 that is separate from Vdd1 as received by PU 130.

Both PU 130 and PU 140 include a number of sensors 120. The particular number of sensors shown here is exemplary, and in actual embodiments may be greater, lesser, or equal. The sensors 120 may be configured for sensing one or more performance metrics, or parameters. In this particular embodiment, the sensors are configured to sense voltage and temperature values. The sensed voltage and temperature values may in turn be used to determine whether or not circuitry implemented therein is operating within limits and/or is capable of higher performance.

Each of the sensors 120 in the embodiment shown is coupled to the same voltage supply as the functional circuitry in its respective one of the functional circuit blocks. That is, each sensor 120 in PU 130 is coupled to receive a supply voltage Vdd1, while each sensor in GPU 140 is coupled to receive Vdd2. In prior art embodiments, such sensors are typically coupled to receive power from a supply separate from that of the functional circuitry near which they are implemented. This may limit their placement within an IC/functional circuit block due to the need to route connections for another voltage supply. Furthermore, the sensors in prior art embodiments may typically be larger than those used in the embodiments discussed herein, which may further limit their number and placement. In contrast, the sensors 120 implemented herein may be simplified sensors. Accordingly, sensors 120 may be smaller than prior art sensors. This in turn may allow more sensors to be place on an IC. Furthermore, the sensors may be placed in smaller areas, increasing the versatility of their implementation. In one embodiment, sensors 120 may be implemented using one or more ring oscillators. However, since the frequency produced by a ring oscillator may show a significant dependence on process, voltage, and temperature variations, the ring oscillators may be calibrated such that these dependencies do not adversely affect their accuracy. Various calibration and operation methodologies are discussed in further detail below. It is noted that an initial calibration (and characterizations) for each sensor may be performed during a test using automated test equipment (ATE) at known voltages and temperatures. Subsequent calibrations may be performed during startup and/or operation of the system in which IC 10 is implemented.

IC 10 in the embodiment shown includes metrology control circuitry (MCC) 105. MCC 105 may perform various operations involved with operation of the sensors 120 in the various functional circuit blocks of IC 10. In the embodiment shown, MCC 105 is coupled to each of the sensors 120 via a metrology bus 13. During operation of IC 10, each of the sensors 120 may perform readings of, e.g., a frequency of their respective ring oscillator(s), convert the frequency reading into a digital format, and transmit that information to MCC 105. In this embodiment, MCC 105 is a serial bus, and information may be shifted on the bus in operation that is similar to that of a scan chain. However, embodiments utilizing different mechanisms for communications with the sensors are possible and contemplated.

MCC 105 may receive the frequency information from each of the sensors via their correspondingly coupled instances of metrology bus 13. Using the frequency information, MCC 105 may determine a voltage and temperature sensed by each of sensors 120. In the embodiment shown, MCC 105 includes a service processor 111 and a memory 112. Service processor 111 may execute instructions of a software routine to solve for voltage and temperature values based on frequency information received from each of the sensors 120. Embodiments in which dedicated circuitry performs these task in lieu of the execution of software instructions are also possible and contemplated. Memory 112 may be used by service processor to store various information, including the frequency information received from the sensors, the determined voltage and temperature information, and intermediate information generated during the performance of calculations. Memory 112 may also store information characterizing the sensors and the circuitry therein (e.g., the ring oscillators). Memory 112 may be implemented using volatile memory, non-volatile memory, or a combination thereof MCC 105 also includes an instance of a sensor 120, implemented in a reference circuit 107. Sensor 120 of MCC 105 is coupled to receive supply voltage AVdd. Furthermore, sensor 120 may be configured in accordance with the other instances of sensor 120 implemented on IC 10. This particular instance of sensor 120 may provide readings used as a basis for determining the characteristics of the other sensors 120 in the system. Although not explicitly shown in FIG. 1, a "golden" temperature sensor may be implemented near sensor 120 of MCC 105. This temperature sensor may be designed to be highly accurate. Similarly, the power supply that provides AVdd is a precision power supply with a tightly controlled voltage. Accordingly, any error in the voltage and temperatures determine using sensor 120 of MCC 105 may be calculated with a high degree of precision. In turn, these errors can be used in calibration and characterization of the other sensors 120 implemented throughout the system. Furthermore, readings obtained from sensor 120 of MCC 105 may be used to determine if and when recalibrations of the other sensors 120 may be necessary.

Figure 2:
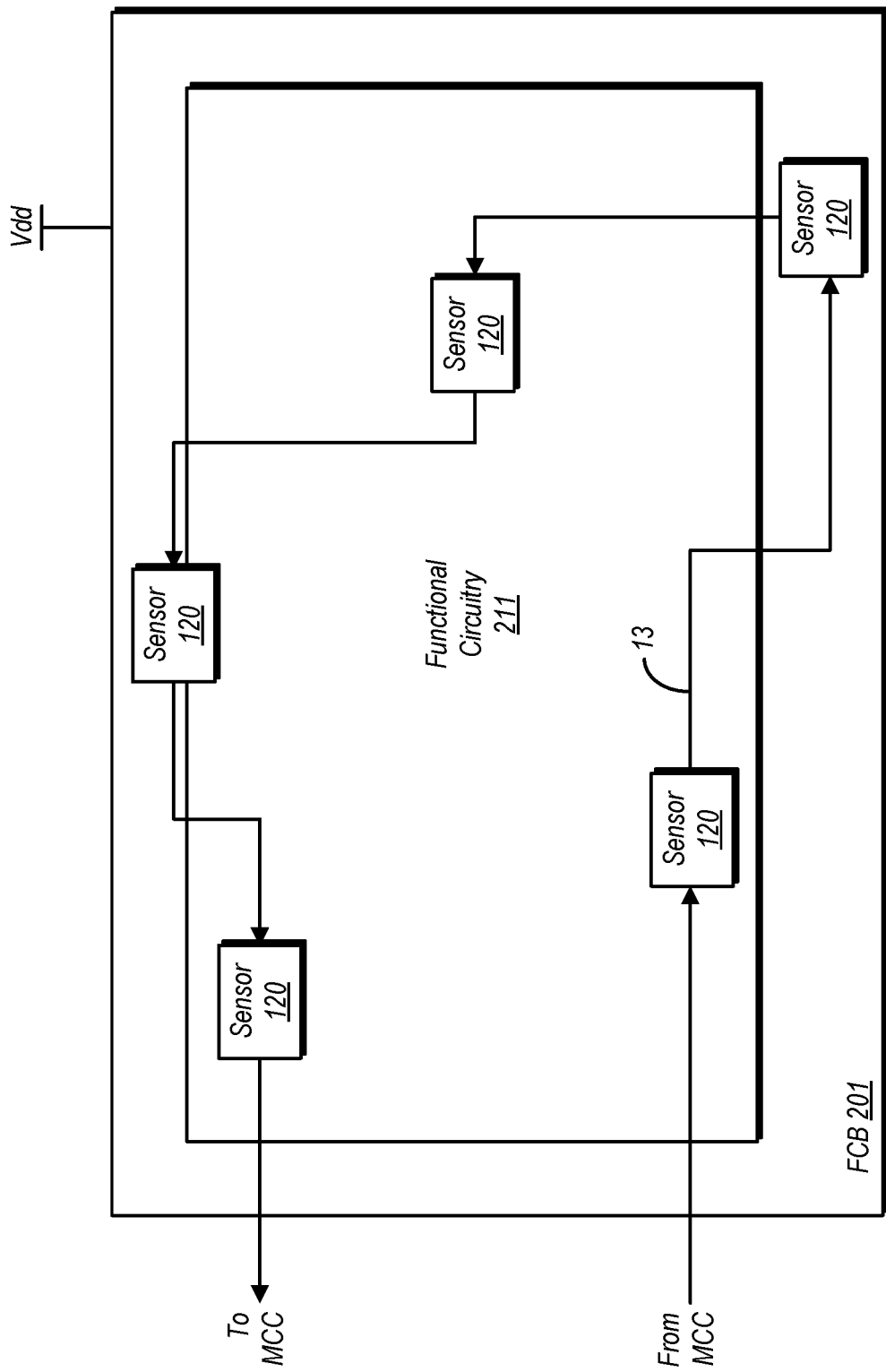
FIG. 2 is a block diagram of one embodiment of a functional circuit block having a number of sensors.

FIG. 2 is a block diagram of one embodiment of a functional circuit block having a number of sensors 120. In the embodiment shown, functional circuit block (FCB) 211 may be virtually any type of functional circuitry implemented on an IC. Included in functional circuitry 211 may be digital circuits, analog circuits, and mixed signal circuits. Sensors 120 of FCB 211 are implemented in various places in and around functional circuitry 211. Due to their relatively small footprint, at least some sensors 120 may be implemented within the area otherwise occupied by functional circuit 211, while others may be implemented near or partially within. The sensors 120 in this embodiment are coupled in a series configuration by metrology bus 13, through which data (e.g., frequency data for ring oscillators) may be shifted. Each of the sensors 120 in the embodiment shown is coupled to receive the same supply voltage, Vdd, as received by the functional circuitry 211.

Figure 3:
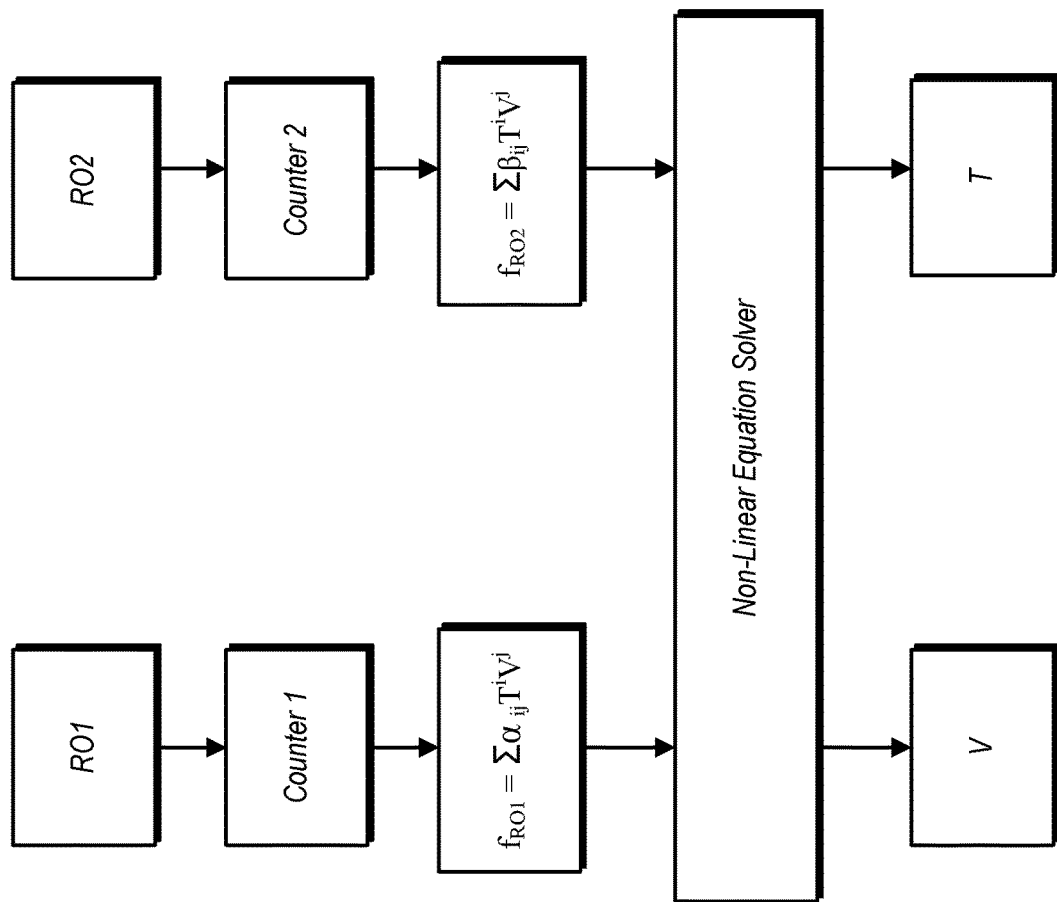
FIG. 3 is a block diagram illustrating an operational concept for an embodiment of a sensor employing two ring oscillators.

FIG. 3 is a block diagram illustrating an operational concept for an embodiment of a sensor employing two ring oscillators. In some embodiment, each sensor included two ring oscillators that are designed to have characteristics different from one another. The two ring oscillators may be implemented in close proximity to one another, and thus may operate under substantially the same voltage and temperature conditions. However, since their characteristics are different from one another, the two ring oscillators may operate at different frequencies under the same voltage and temperature conditions. This principle may enable the determination of voltage and temperature at the sensor using frequency readings from each of the ring oscillators.

In the illustrated example, two ring oscillators, RO1 and RO2 are coupled to Counter 1 and Counter 2, respectively. In taking a reading, each ring oscillator may be allowed to toggle its respectively coupled counter for a predetermined amount of time. After the predetermined time has elapsed, the counters may be frozen and their count values provided to indicate frequency.

Each of the ring oscillators may be characterized by a polynomial. More particularly, the frequency output by each ring oscillator may be characterized by a nonlinear function of voltage and temperature in a form given as shown in Equation 1:

$$f_{RO} = \Sigma \alpha_{ij} T^i V^j \quad (1)$$

Thus, the frequency of RO1 may be characterized as:

$$f_{RO1} = \Sigma \alpha_{ij} T^i V^j \quad (2),$$

while the frequency of RO2 may be characterized as:

$$f_{RO2} = \Sigma \beta_{ij} T^i V^j \quad (3).$$

The 'f' terms in the above equations may represent frequency, or alternatively, may represent a ratio of a product of the oscillating frequency and the number of phases to a reference frequency. The determination of the number of terms in this expression corresponding to a given ring oscillator is dependent on its characteristics. In general, a higher number of nonlinear terms increases the accuracy of representing the ring oscillator frequency with polynomials.

The output frequencies (or the product mentioned above) may be provided to a non-linear equation solver. Using the polynomials characterizing the ring oscillators, the simultaneous equations may be solved for both voltage and temperature as detected by the sensor. In one embodiment, the non-linear equation solver may be implemented using the service processor 111 (of FIG. 1) and software instruction executed thereby. More generally, the non-linear equation solver may be implemented using hardware, software, firmware, and any combination thereof. Moreover, it is possible and contemplated in some embodiments that the solving of the non-linear equations may be performed locally in the corresponding functional circuit blocks.

The coefficients in the equations above may be calculated based on actual ring oscillator frequencies for a given set of voltage and temperature values. Consider a model of a ring oscillator in which the frequency is defined using a 9-term function a set of 24 data points (voltage, temperature, and output frequency) used to calculate the ring oscillator characteristics. If a higher number of data points is used to determine coefficients, the resulting function may better characterize the corresponding ring oscillator. This technique may be referred to as surface fitting of the ring oscillator characteristic, and may use numerical techniques to map a large set of data points to a polynomial.

As an example, consider a frequency of a ring oscillator as being defined by the following expression:

$$f_{RO} = \alpha_{22}T^2V^2 + \alpha_{21}T^2V^1 + \alpha_{20}T^2V^0 + \alpha_{12}T^1V^2 + \alpha_{11}T^1V^1 + \alpha_{10}T^1V^0 + \alpha_{02}T^0V^2 + \alpha_{01}T^0V^1 + \alpha_{00}T^0V^0 \quad (4)$$

If measurements of ring oscillator frequency occur at $$\{(f_0, V_0, T_0), (f_1, V_1, T_1), \ldots, (f_{23}, V_{23}, T_{23})\},$$

then the following matrices can be formed:

$$F = [f_0 f_1 \ldots f_{23}] \quad (5)$$

$$A = [\alpha_{22}\ \alpha_{21}\ \alpha_{20}\ \alpha_{12}\ \alpha_{11}\ \alpha_{10}\ \alpha_{02}\ \alpha_{01}\ \alpha_{00}] \quad (6)$$

$$X = [X_0\ X_1 \ldots X_{23}],$$

in which $X_j =$ $$[T_j^2 V_j^2\ T_j^2 V_j^1\ T_j^2 V_j^0\ T_j^1 V_j^2\ T_j^1 V_j^1\ T_j^1 V_j^0\ T_j^0 V_j^2\ T_j^0 V_j^1\ T_j^0 V_j^0]^T \quad (7).$$

Accordingly, the frequency F can be defined as $F = AX$ (8). The term A can be solved for using Least Squares Estimation, computing all the coefficients in the original surface fit.

This concept can be expanded to two ring oscillators that have a different set of characteristics by characterizing each as described above. Accordingly, two ring oscillators placed in close proximity to one another, receiving the same supply voltage, and operating at substantially the same local temperature, can be characterized in two expressions as follows:

$$\begin{cases} f_{RO1} = \Sigma_{i,j} \alpha_{ij} T^i V^j \\ f_{RO2} = \Sigma_{i,j} \beta_{ij} T^i V^j \end{cases} \quad (9)$$

The above assumes that the two ring oscillators are characterized with polynomials having equal lengths, although this is not necessarily required for all instances.

The complexity of solving the simultaneous equations above may be reduced using a piecewise linear (PWL) technique. Using this technique, a two-dimensional nonlinear surface for the output frequency of a ring oscillator can be described using a set of PWL functions. The surface of operation over an entire voltage and temperature can be split into multiple triangular regions over each of which the characteristics of a corresponding can be described using a linear function of voltage and temperature. Thus, the overall surface may be broken into an integer number n of PWL regions, described as follows:

$$f = \begin{cases} a_{T1}T + a_{V1}V + a_{C1} & \text{for region 1} \\ a_{T2}T + a_{V2}V + a_{C2} & \text{for region 2} \\ \vdots \\ a_{Tn}T + a_{Vn}V + a_{Cn} & \text{for region } n \end{cases} \quad (10)$$

The coefficients for each of the PWL functions can be determined using the output frequencies at the three vertices of the triangle describing any given area. For example, for PWL function describing a triangle extending between temperatures T1 and T2 on a first axis and a voltages V1 and V2 on a second axis, with the frequencies measured at $(T_1, V_1)$, $(T_1, V_2)$, and $(T_2, V_1)$ respectively given by $f_1$, $f_2$, and $f_3$ and the index for the PWL is given as i, the following set of equations can be solved in order to compute the coefficients for the corresponding PWL function in that area:

$$\begin{cases} f_1 = a_{Ti}T_1 + a_{Vi}V_1 + a_{Ci} \\ f_2 = a_{Ti}T_1 + a_{Vi}V_2 + a_{Ci} \\ f_3 = a_{Ti}T_2 + a_{Vi}V_1 + a_{Ci} \end{cases} \quad (11)$$

This can be repeated for every region to determine its PWL characteristic, and thus to determine the surface of operation for the ring oscillator.

Once both ring oscillators have been characterized with a set of PWL function, solving the set of nonlinear equations is reduced to solving a set of PWL equations. The equations to be solved for each PWL computation may be generally described as follows:

$$\begin{cases} f_{RO1} = a_{Ti}T + a_{Vi}V + a_{Ci} \\ f_{RO2} = b_{Ti}T + b_{Vi}V + b_{Ci} \end{cases} \quad (12)$$

Solving these two equations for temperature, T, and voltage, V, results in the following:

$$\begin{cases} T = \frac{(f_{RO1} - a_{Ci})b_{Vi} - (f_{RO2} - b_{Ci})a_{Vi}}{a_{Ti}b_{Vi} - b_{Ti}a_{Vi}} = f_{RO1}\left(\frac{b_{Vi}}{a_{Ti}b_{Vi} - b_{Ti}a_{Vi}}\right) + \\ \qquad f_{RO2}\left(\frac{-a_{Vi}}{a_{Ti}b_{Vi} - b_{Ti}a_{Vi}}\right) + \left(\frac{a_{Vi}b_{Ci} - b_{Vi}a_{Ci}}{a_{Ti}b_{Vi} - b_{Ti}a_{Vi}}\right), & (13) \\ V = -\frac{(f_{RO1} - a_{Ci})b_{Ti} - (f_{RO2} - b_{Ci})a_{Ti}}{a_{Ti}b_{Vi} - b_{Ti}a_{Vi}} = f_{RO1}\left(\frac{-b_{Ti}}{a_{Ti}b_{Vi} - b_{Ti}a_{Vi}}\right) + \\ \qquad f_{RO2}\left(\frac{a_{Ti}}{a_{Ti}b_{Vi} - b_{Ti}a_{Vi}}\right) + \left(-\frac{a_{T}b_{Ci} - b_{Ti}a_{Ci}}{a_{Ti}b_{Vi} - b_{Ti}a_{Vi}}\right) & (14) \end{cases}$$

As previously noted, the calculations discussed herein may be performed in MCC 105, and particularly in service processor 111. This may allow each sensor 120 to be implemented in a small area and limit its power consumption, since it need not perform any conversion of frequency to voltage and/or temperature. More generally, the features used for frequency measurement may be implemented within each sensor 120, while those features used for PWL computation, calibration against process variation, again, and accuracy may be implemented within MCC 105.

A surface fit of each ring oscillator (and thus its respective PWL representation) may change over each process corner and may also be subject to local on-die variations. Moreover, the accuracy of a given ring oscillator may be reduced due to effects such as aging. Accordingly, a calibration scheme used for such ring oscillators may update the characteristics of each. These characteristics may be updated based on a limited set of accurate measurements from each ring oscillator. If an original (but not accurate) model for a given ring oscillator is $$f_{RO\_precal} = \Sigma_{i,j} \alpha_{ij} T^i V^j \quad (15),$$

a set of actual measurements may be performed to update the coefficients such that a more accurate model of the ring oscillator is as follows:

$$f_{RO\_postcal} = \Sigma_{i,j} \alpha^*_{ij} T^i V^j \quad (16).$$

This calibration factors in both the original model and a set of calibration points. As the number of points increases, the accuracy increases correspondingly. Conversely, the efficiency of a calibration algorithm may be determined by the accuracy of the post-calibration model based on a smallest number of data points.

In one embodiment, a calibration algorithm in accordance with the disclosure includes updating the coefficients using a scaled value of the error signal at any calibration point. For any of the calibration points, the error signal (e) may be defined as the difference between the actual measurement and the value predicted by the model. That means $\forall \in \{1,2,\ldots,m\}$:

$$e_k = f_k - \Sigma_{i,j} \alpha_{ij} T_k^i V_k^j \quad (17).$$

If the coefficients in the original model ($\alpha_{ij}$) are consolidated in a vector given as $A_0$, a recursive approach may be utilized in which the vector is updated for every single calibration point:

$$A_k = A_{k-1} e_k G \quad (18).$$

In one embodiment, the G vector may be determined using the Recursive Least Squares (RLS) technique. This may in turn result in a relatively fast convergence to final desired values based on a limited set of calibration data. In using the RLS technique, the G vector is recursively updated during each step. The RLS technique may utilize an alternate characterization of a ring oscillator as follows:

$$f_{RO_{precal}} = A_0 U^T \quad (19),$$

wherein U is a vector of the (i+1)(j+1) terms, i.e.:

$$U = [T^i V^j \; T^{i-1} V^j \ldots T^0 V^0] \quad (20).$$

From this, a diagonal matrix may be formed:

$$P_0 = \begin{bmatrix} \text{var}(U(1))^{-1} & 0 & & \\ 0 & \text{var}(U(2))^{-1} & \ldots & 0 \\ & \vdots & \ddots & \vdots \\ & 0 & & \ldots \; dc \end{bmatrix} \quad (21)$$

For any calibration point, the following set of computations may be performed:

$$\begin{cases} r_k = \lambda + U P_{k-1} U^T \\ G_k = \dfrac{1}{r_k} P_{k-1} U^T \\ A_k = A_{k-1} + e_k G_k \\ P_k = \dfrac{1}{\lambda} P_{k-1} - \dfrac{1}{\lambda} G_k U P_{k-1} \end{cases} \quad (22)$$

wherein $\lambda$ is a forgetting factor, and e is the error.

Accordingly, using a recursive least squares algorithm, such as that described above, the coefficients for a polynomial characterizing a ring oscillator may be updated during a calibration procedure. Such calibrations may be performed at various times, such as on a system startup, at selected times during the life of the system/IC, responsive to large variations in the reference sensor 107 and the sensor 120 in MCC 105, and so forth. As such, voltage and temperature, based on ring oscillator frequencies, may be determined with a reasonable level of accuracy over the life of the system, while enabling the use of simple sensors having a small area footprint.

Figure 4:
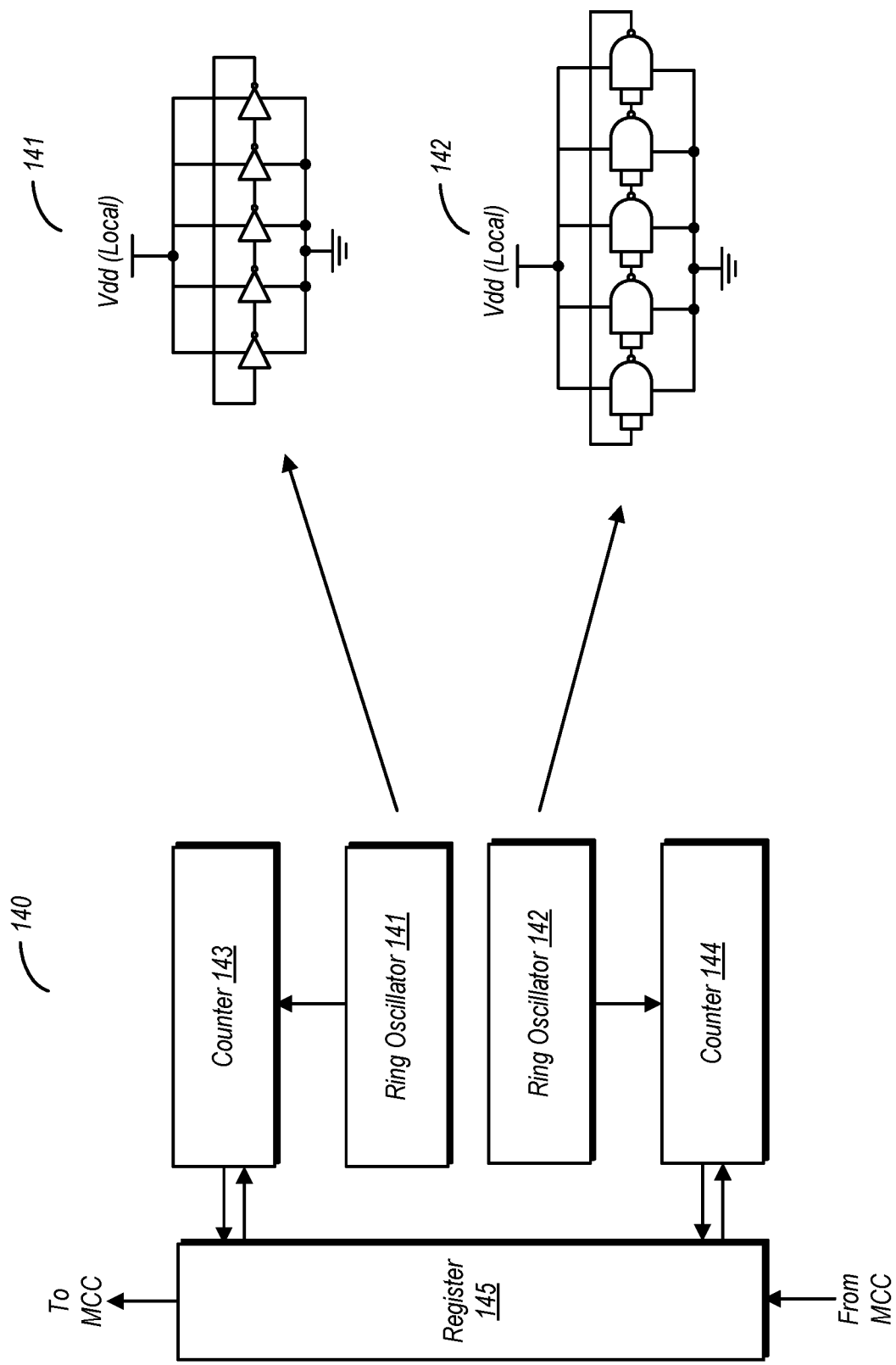
FIG. 4 is a block diagram of one embodiment of a sensor having two ring oscillators.

FIG. 4 is a diagram illustrating one embodiment of a sensor utilizing two ring oscillators. In the embodiment shown, sensor 140 includes ring oscillators 141 and 142, which may have different characteristics with respect to one another. In this particular embodiment, ring oscillator 141 is implemented using series-coupled inverters, while ring oscillator 142 is implemented using series-coupled NAND gates. Both of ring oscillators 141 and 142 are coupled to receive the same supply voltage, Vdd (Local), and are placed in close proximity to one another. However, due to the different circuit implementations, ring oscillators 141 and 142 may oscillate at different frequencies in identical operating conditions. In accordance with the discussion above, this may enable the respective frequencies produced by ring oscillators 141 and 142 to be the basis for solving for voltage and temperature at sensor 140.

Ring oscillators 141 and 142 are coupled to counters 143 and 144, respectively. These counters may be coupled to one or more tap points in their respectively coupled ring oscillators. During the taking of a measurement, counters 143 and 144 may track one or more count values that may in turn indicate the frequencies produced by ring oscillators 141 and 142, respectively. In some embodiments, each of counters 143 and 144 may include respective timer that track a run time for allowing counters to accumulate a count during a measurement. Other embodiments are possible and contemplated in which a separate timer coupled to both counters is provided.

Counters 143 and 144 are each coupled to register 144. Using register 144, MCC 105 (of FIG. 1) may input information into the counters, and may also receive information therefrom. For example, information indicative of a run time for a counter to track a count value produced by the oscillation of a correspondingly coupled ring oscillator may be input into the counters, from MCC 105, via register 145. A start indication may also be input through register 145. From counters 143 and 144, register 145 may receive the count values produced during an actual measurement. In accordance with the embodiment shown in FIG. 1, these values may be serially shifted through metrology bus 13 to MCC 105 for use in computing the voltage and temperature values. Embodiments in which register 145 is directly coupled to an implementation of MCC 105 are also possible and contemplated.

Figure 5:
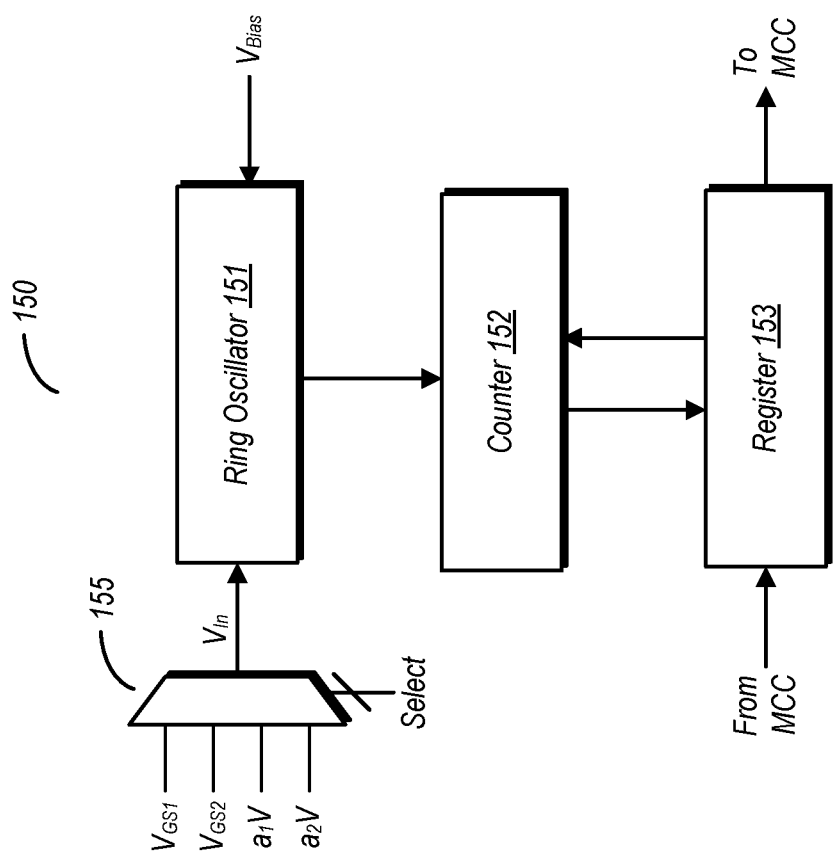
FIG. 5 is a block diagram of one embodiment of a sensor having a single ring oscillator.

FIG. 5 is a diagram illustrating one embodiment of a sensor utilizing a single ring oscillator. Using this type of sensor, voltage and temperature may be determined using a multi-sensing technique in which measurements are taken using a single ring oscillator with measurements performed at different input voltages. Ring oscillator 151 in this particular embodiment is coupled to receive a bias voltage, $V_{Bias}$, and a selectable input voltage, $V_{in}$. The bias voltage may be generated by any suitable circuitry for generating such a voltage, and may be substantially the same for all measurements. The circuitry for generating the bias voltage may be local to the sensor, or may be generated globally and distributed to each of the sensors. The input voltage, $V_{in}$, may be any one of the voltage input through selection circuit 155. Generation of these voltages for one embodiment is further described below in reference to FIG. 6. Control of the selection signal for selecting these voltages may be performed by MCC 105.

Ring oscillator 151 in the embodiment shown is coupled to counter 152 via one or more tap points, and may cause the counter to toggle when operating. Counter 152 may thus track the count value, and at the end of a predetermined period, may discontinue counting and provide the count value to register 153. The count value may then be forwarded to MCC 105 for voltage and temperature computation. Similarly, counter 152 may receive information from MCC 105, via register 153, in a manner similar to that described above with reference to the embodiment of FIG. 4.

Ring oscillator 151 may be characterized by a polynomial in a manner similar to that described above with reference to FIG. 3. The technique may involve a surface fitting technique for multiple frequency measurements at multiple voltages and frequencies. That is, the frequency response of ring oscillator 151, in terms of voltage and temperature, can be characterized per equations (1) and (4) above.

To perform voltage and temperature measurements, frequency measurements may be made at the four different input voltages provided through selector 155. The following frequency measurements may be made:

$$\text{for } V_{in}=V_{GS1} f_1 = f_0 + K_{VCO}(V_{GS1}-V_0) \tag{23},$$

$$\text{for } V_{in}=V_{GS2} f_2 = f_0 + K_{VCO}(V_{GS2}-V_0) \tag{24},$$

$$\text{for } V_{in}=\alpha_1 V f_3 = f_0 + K_{VCO}(a_2 V-V_0) \tag{25}, \text{ and}$$

$$\text{for } V_{in}=a_2 V f_4 = f_0 + K_{VCO}(a_2 V-V_0) \tag{26}.$$

The above set of equations assume that $a_1 V$ and $a_2 V$ are chosen to be close to $V_{GS1}$ and $V_{GS2}$ so that the same linearized model of the ring oscillator (i.e. $K_{VCO}$, $V_0$, and $f_0$) can be used for all of them.

From the above measurement, the following equation may be deduced:

$$(f_4-f_3)/(f_2-f_1)=(a_2-a_1)V/(V_{GS1}-V_{GS2}) \tag{27}.$$

In the subthreshold region $V_T \ln N$, and VT can be rewritten as kT/q. Accordingly, equation 25 can be rewritten as $$(f_4-f_3)/(f_2-f_1)=(\alpha_2-\alpha_1)V/(kT/q)\ln N \tag{28}.$$

From this, the ring oscillator characterization can be reduced to:

$$f_{RO}=\Sigma \beta_{ij} T^i V^j \tag{29}.$$

Using equation 27, temperature T can be solved for and plugged back into the polynomial characterization to solve for voltage V.

For calibration using ATE, frequencies may be determined at two temperatures and two supply voltages. Linear interpolation may be used for other measured frequencies. Additional frequency measurements may improve the surface fit. During operation, additional measurements may be taken, with the results used to replace interpolated values until a desired number have been replaced. This in turn may improve the accuracy of measurements taken during normal operation.

Figure 6:
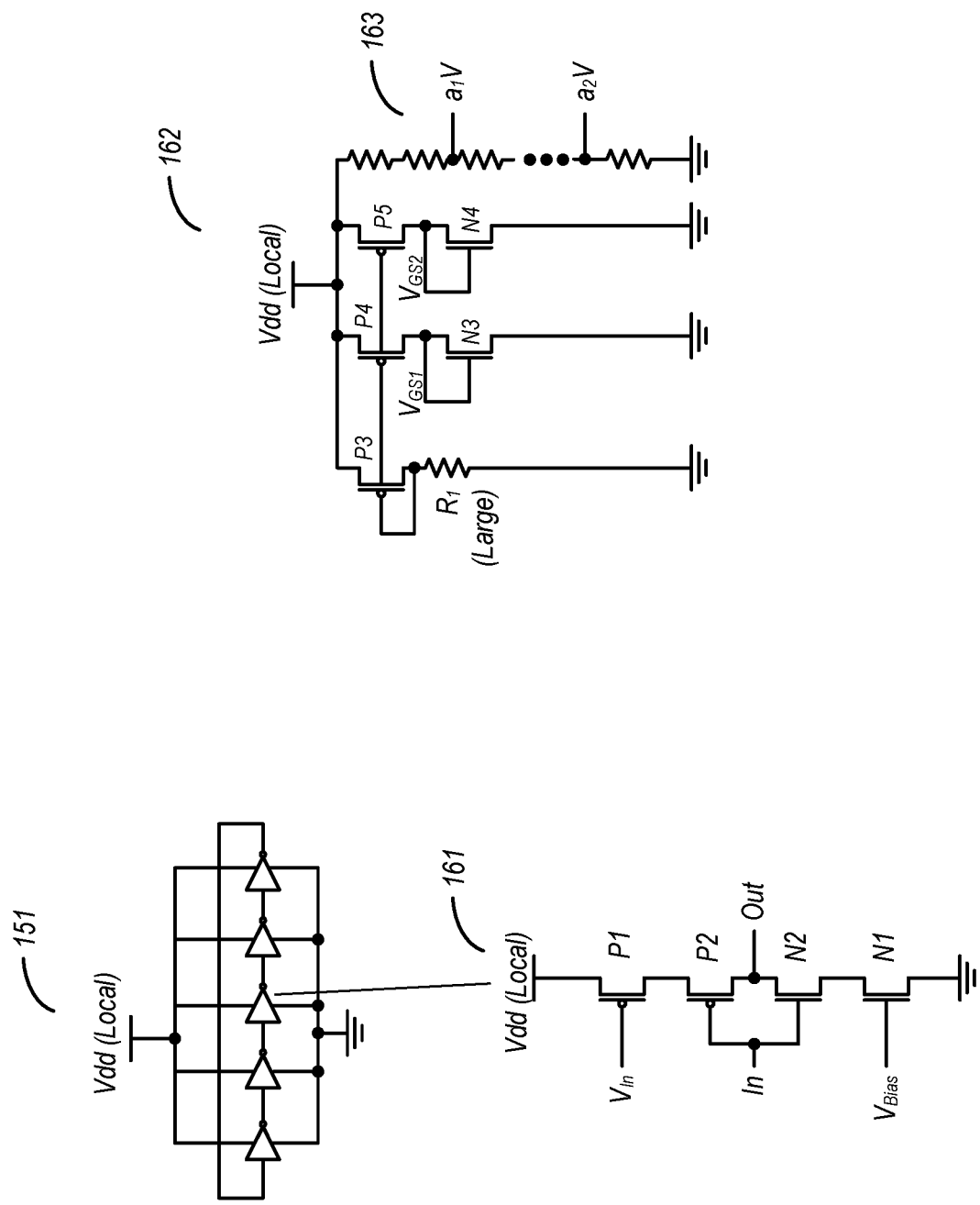
FIG. 6 is a schematic diagram of one embodiment of circuitry used in implementing a ring oscillator.

FIG. 6 includes schematic diagrams of circuit elements used in and with a sensor 150. In the embodiment shown, ring oscillator 151 includes a number of serially-coupled inverters 161. Each inverter 161 includes a stack of two PMOS (p-channel metal oxide semiconductor) and two NMOS (n-channel metal oxide semiconductor) transistors. The PMOS stack includes P1 and P2, while the NMOS stack includes N1 and N2. During operation, the gate terminal of P1 receives one of the input voltages discussed above in reference to FIG. 5. Similarly, N1 receives the bias voltage $V_{Bias}$ on its respective gate terminal. P2 and N2 each have respective gate terminals coupled to the input node and respective drain terminals coupled to the output node. Accordingly, P2 and N2 operate to perform the actual inverter functions. N1 operates to set characteristics of the inverter, while P1 operates, via the different values of $V_{in}$, to vary the characteristics of the inverter. Each inverter 161 of ring oscillator 151 may be configured in this manner. In varying the input voltage provided to P1 of each of the inverters 161, the characteristics of and thus frequency output by ring oscillator 151 may be varied. This in turn may allow for calibrations and measurements to be performed to determine the temperature and voltage (i.e. the supply voltage) detected by each sensor.

Reference circuit 162 in the embodiment shown is configured to generate the various voltages that may be provided as $V_{in}$ to P1 of each inverter 161. The circuit includes PMOS transistors P3, P4, and P5, and NMOS transistors N3 and N4. Transistor P3 is coupled between Vdd (Local) and resistor R1, which has a relatively large resistance value. This resistor sets the gate voltage for P3, P4, and P5. Voltages $V_{GS1}$ and $V_{GS2}$ are taken from the drain terminals of P4 and P5, respectively. The relative sizing of P4 to P5 is 1:N, and thus voltages $V_{GS1}$ and $V_{GS2}$ are different (this is also the source of the 'N' term in equation 26). Using a large resistance value for R1 ensures that the current flowing through N3 and N4 is very small and thus devices operate in subthreshold region. This guarantees that the difference between $V_{GS1}$ and $V_{GS2}$ is a proportional to absolute temperature (PTAT) voltage. The other two voltages, $a_1 V$ and $a_2 V$, are produced from tap points on resistor ladder 163.

Reference circuit 162 may be implemented in various ways. In one embodiment, each sensor may include a reference circuit 162 dedicated thereto. In another embodiment, each functional circuit block may have a reference circuit 162 that provides these voltages to the ring oscillator 151 of each sensor. In yet another embodiment, each different voltage supply (or voltage rail) may associated with on reference circuit 162, which distributes the various voltages to each ring oscillator 151 that receives it supply voltage from the same source.

Figure 7:
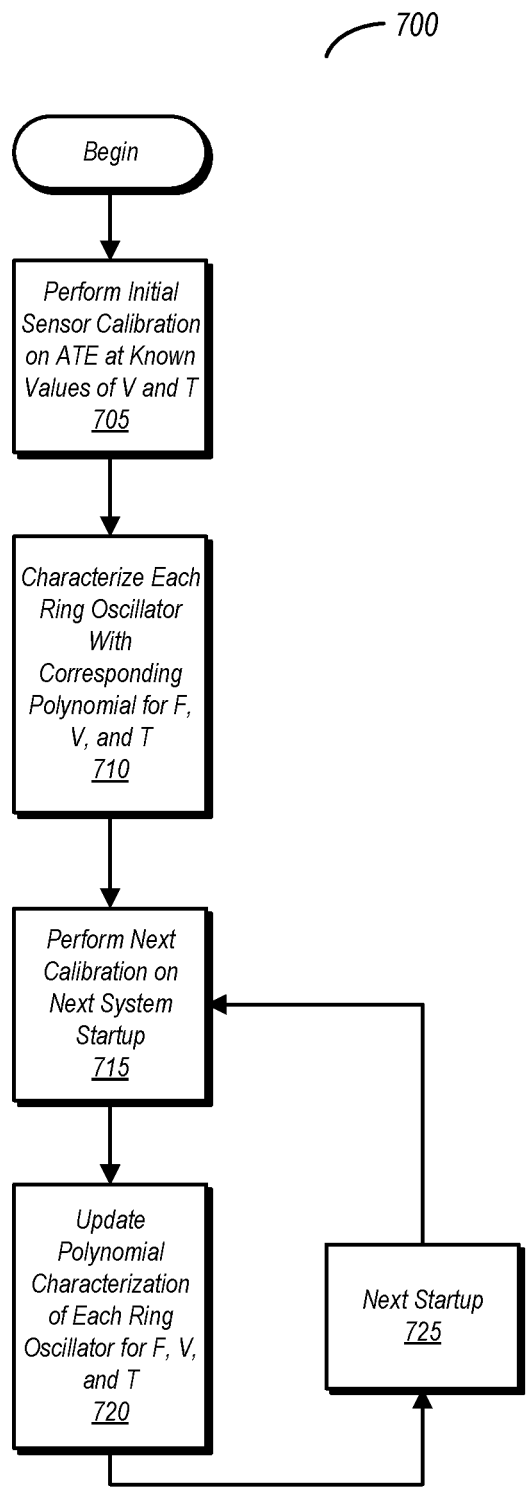
FIG. 7 is flow diagram of one embodiment of a method for calibrating sensors on an IC.

FIG. 7 is a flow diagram of one embodiment of a method for performing a calibration of a sensor or sensors in IC, wherein the sensors utilize ring oscillators. Method 700 may be performed using any of the various circuit embodiments discussed above, as well as with software and/or firmware associated therewith. Other hardware/software/firmware embodiments not explicitly discussed herein that are also capable of performing method 700 are possible and contemplated.

Method 700 begins with an initial sensor calibration performed on ATE using known values of V and T (block 705). In one embodiment, each ring oscillator may be calibrated using at least two different points of V and T. Interpolation between these points may be used in completing the initial characterization for each ring oscillator. Additional points may be used as well, if desired. The number of points used in each this portion of the calibration may vary based on desired accuracy, allowable time on ATE for each unit of the IC, available processing capability and available memory capability. In general, the greater the number of points used, the more accurate the initial calibration will be, although this typically results in greater time for each unit of the IC on ATE.

It is further noted that the calibrations performed herein may include performance of the various mathematical methodologies discussed above. However, other methodologies that include the characterization of a ring oscillator using a polynomial or other mathematical function are also possible and contemplated.

Based on the points used in the ATE calibration, each ring oscillator may be characterized with a polynomial that expresses the frequency of operation of the ring oscillator as a function of voltage and temperature (block 710). This polynomial may provide a starting point for subsequent calibrations, and may be update responsive thereto.

A next calibration may be performed on subsequent startup of the system that includes the IC upon which the sensors are implemented (block 715). Responsive to these subsequent calibrations, the polynomials characterizing each ring oscillator may be updated (block 720). At each subsequent next startup (block 725), the method may return to block 715, and another calibration is performed with another update of each polynomial corresponding to a calibrated ring oscillator.

The performance of calibrations is not limited to those instances discussed above. For example, calibrations may also be performed periodically during operation in one embodiment. In another embodiment, the V and T values detected by a sensor in MCC 105 (or equivalent circuit/unit) and a more accurate reference sensor may be monitored. If the values of V and T detected by the sensor (which is configured as those in the functional circuit blocks) and the reference sensor are different by more than a predetermined value, a calibration may be performed responsive thereto. In yet another embodiment, if the difference between the detected V and T values by the sensor and the reference sensor changes at a sudden rate, or more than a predetermined rate, a calibration may be performed. Accordingly, the methodology discussed herein may be construed to include such embodiments within its scope.

Figure 8:
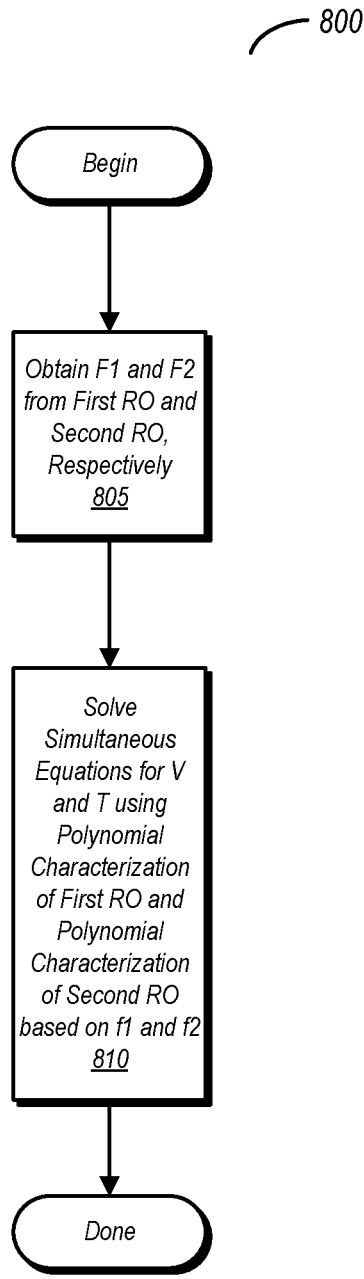
FIG. 8 is a flow diagram of one embodiment of a method for determining voltage and temperature indicated by a sensor using two ring oscillators.

FIG. 8 is a flow diagram of one embodiment of a method for determining voltage and temperature indicated by a sensor using two ring oscillators. The embodiment of method 800 discussed herein may be performed using any of the embodiments in which sensors utilize two ring oscillators having different characteristics. The configuration of the ring oscillators may include those explicitly discussed above, as well as those not explicitly discussed herein. The various mathematical methodologies discussed above may be used to characterize the ring oscillators employed in a particular embodiment. Additional mathematical methodologies not explicitly discussed herein may also be utilized within the scope of this disclosure.

Method 800 begins with the obtaining of frequency values f1 and f2 from first and second ring oscillators, respectively (block 805). These frequency values may be inserted into the polynomial expressions that characterize the respective ring oscillators from which they were produced. Since the ring oscillators may be placed in close proximity to one another and thus operate in substantially the same voltage and temperature conditions, the corresponding polynomials by which they are characterized can be considered simultaneous equations. Accordingly, the simultaneous equations can be solved for voltage and temperature based on the indicated values of f1 and f2 (block 810).

Figure 9:
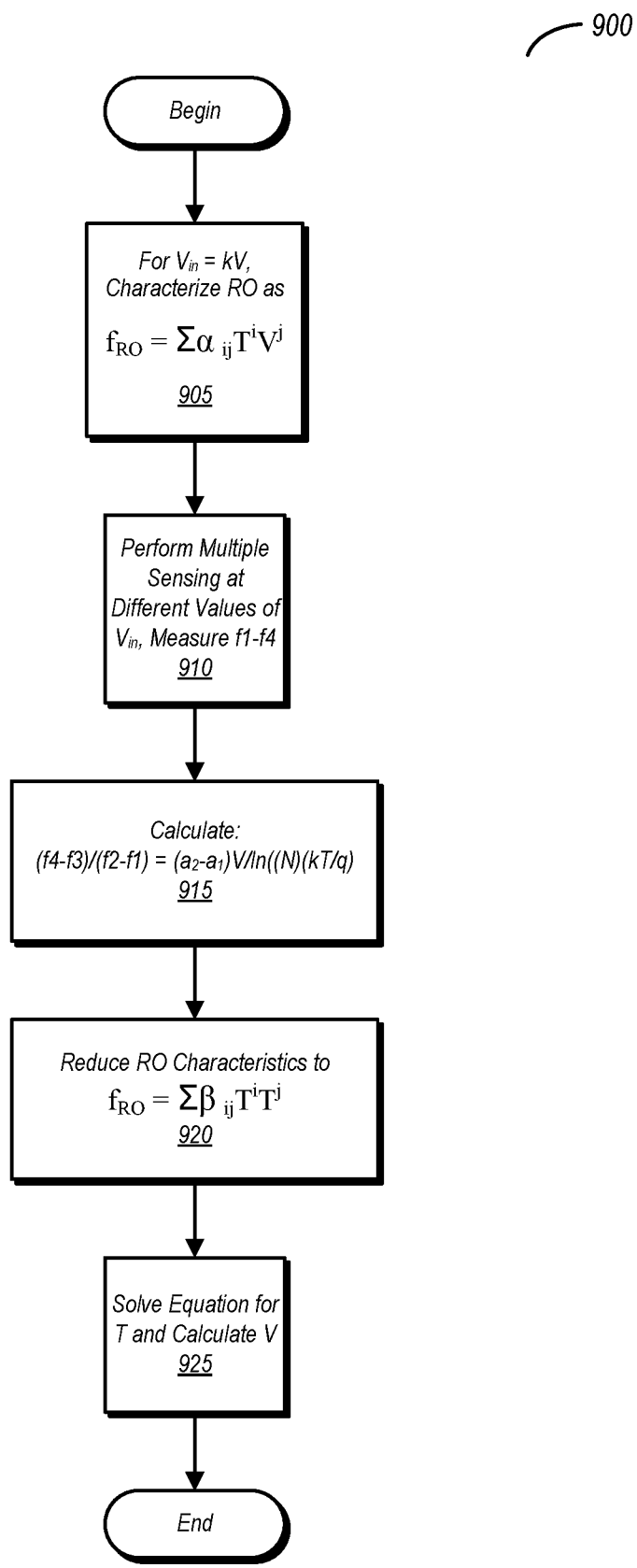
FIG. 9 is a flow diagram of one embodiment of a method for determining voltage and temperature indicated by a sensor using a single ring oscillator.

FIG. 9 is a flow diagram of one embodiment of a method for determining voltage and temperature indicated by a sensor using a single ring oscillator. Method 900 as discussed herein may be performed using various embodiment that include sensors having a single ring oscillator as discussed above. Other hardware embodiments, as well as supporting software and/or firmware embodiments not explicitly discussed herein are also contemplated as being capable for performing method 900, and thus fall within the scope of this disclosure.

Method 900 with characterizing a ring oscillator as a polynomial function in which the output frequency is a function of voltage and temperature (block 905). After characterization is performed, perform multiple sensing using different values of $V_{in}$, measuring frequencies f1-f4 (block 910). Using the frequency values determined, a calculation is made based on equation (26) discussed above (block 915). From this the ring oscillator characteristic may be reduced to equation 27 as discussed above, wherein one of the voltage terms is replaced with a temperature term (block 920). Having replaced one of the voltage terms with a temperature term, equation 27 may be solved for temperature T, and based thereon, the voltage V may be calculated (block 925).

Figure 10:
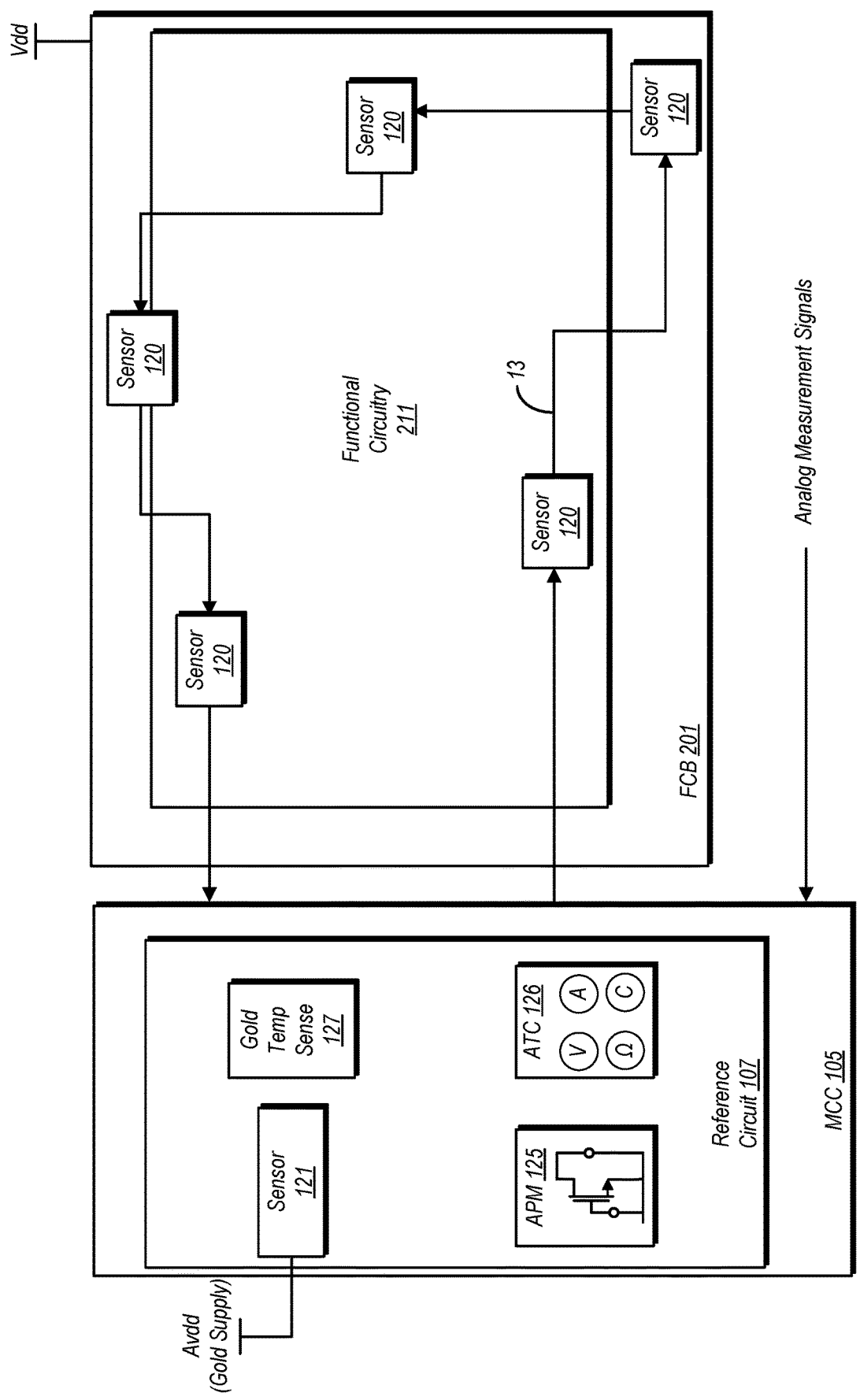
FIG. 10 is a block diagram of one embodiment of an IC including a metrology golden reference center.

FIG. 10 is a block diagram illustrating one embodiment of a reference circuit 107 implemented in an instance of MCC 105, as well as its relationship to the disclosed metrology system as a whole. In the embodiment shown, the reference circuit 107 (which may also be referred to as the metrology golden reference center), is coupled to a number of sensors 120 in functional circuitry 211. The functional circuitry 211 may comprise a central processing unit (CPU), graphics processing unit (GPU), or system on a chip (SoC; which may include a GPU and one or more instances of a CPU). It is also noted that, in at least some embodiments, sensors 120 may be implemented in IC's external to the IC upon which the metrology golden reference center is implemented. The golden reference center is coupled to the sensors via MCC 105.

The golden reference center in the embodiment shown includes a sensor 121 that is substantially the same as those distributed throughout the IC. This instance of sensor 121 will be referred to as the reference sensor hereafter. The reference sensor 121 has the exact same topology and substantially the same characteristics as the other sensors 120 in the system, and may thus respond substantially the same as the other sensors to equivalent operating conditions. The reference sensor 121 is coupled to receive its supply voltage from a high precision voltage source, shown here as the Avdd, which may also be referred to as the golden supply. Similarly, a golden temperature sensor 127 is implemented near the reference sensor. The golden temperature sensor 127 is a high accuracy temperature sensor that may be implemented using various circuit topologies and other temperature sensing mechanisms. Modeling of the temperature sensors of the system as a whole may be based on the operation of the reference sensor 121, the golden temperature sensor 127, and the voltage provided by the golden supply. The data obtained from the reference sensor 121 may be correlated to the voltage of the golden supply and the temperature received from the golden temperature sensor 127. The reference sensor 121 may be calibrated based on these correlations. Thereafter, data obtained from the reference sensor 121 may be correlated to the other sensors 120 in the system in order to calibrate them and form the respective polynomial characteristics.

The reference circuit 107 also includes an analog process monitor 125 and an analog test center 126. Circuits in these two units may be used for additional metrology functions on the IC, and, if so connected, for other circuits external to the IC. As is discussed below, the analog process monitor 125 may be used to obtain characteristics of various devices (e.g., transistors) distributed throughout the IC/system. The analog test center 126 may receive data from various parts of the IC/system in order to provide a mechanism for measuring various circuit parameters such as voltage, current, impedance/resistance, and capacitance. The analog test center 126 may be further configured to digitize these values for export and analysis by other parts of the IC or by entities external thereto. Such entities may include, but are not limited to, automated test equipment (ATE) used in initial calibration of the sensors 120/121, as well as other types of test equipment that may be used in conjunction with the IC. Both the analog process monitor 125 and the analog test center 126 will be discussed in further detail below.

Figure 11:
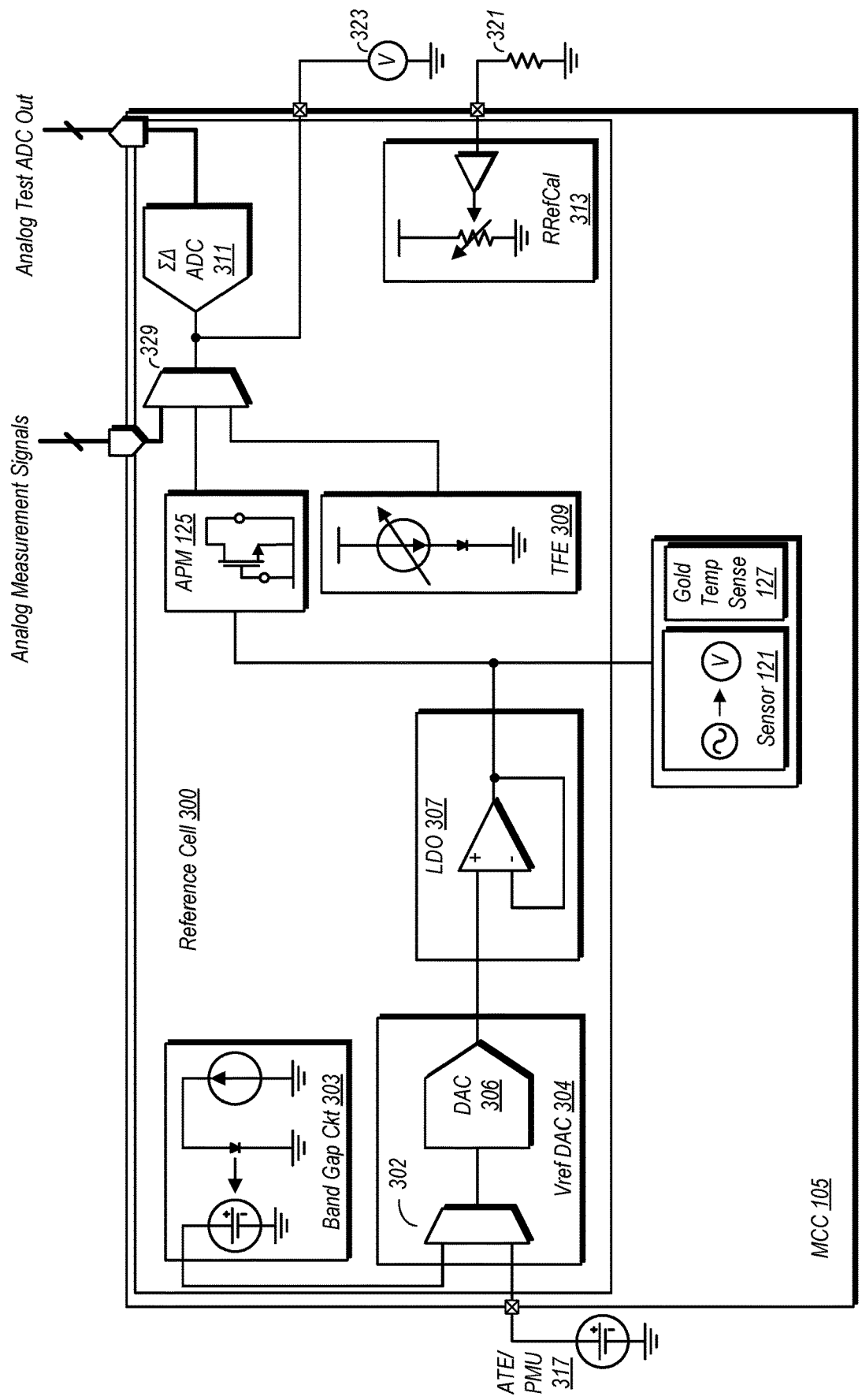
FIG. 11 is a block diagram illustrating one embodiment of a metrology golden reference center.

FIG. 11 is a block diagram further illustrating one embodiment of MCC 105, which includes reference cell 300, reference sensor 121, and golden temperature sensor 127. Included in reference cell 300 is circuitry for producing a highly accurate voltage to be provided to the reference sensor 121. In the embodiment shown, the voltage reference digital-to-analog converter (VREF DAC) 304 includes a multiplexer 302 and a DAC 306. The DAC 306 is coupled to receive, via a multiplexer 302, a metrology reference voltage and/or an output from band-gap circuit 303. Multiplexer 302 may be coupled to various types of circuits such as the band gap circuit 303 and an external reference voltage source. In this example, the reference voltage source is automated test equipment/power management unit (ATE/PMU) 317. Other voltage sources may also be coupled to provide inputs to multiplexer 302. Each of these sources may include circuitry to output a digital value that is representative of a voltage (or desired voltage) to be provided to the DAC 306 via multiplexer 302. In some cases, the voltages may originally be generated as analog values and subsequently converted to digital for transmission to VREF DAC 304. In other cases, the voltages may originate as digital values that are transmitted to VREF DAC. After selection of an input by multiplexer 302 (e.g., due to a selection signal from other control circuitry not shown here), DAC 306 may convert the selected digital value to an analog voltage.

The output of the VREF DAC 304 may be provided to a low dropout (LDO) voltage regulator 307. Using a combination of the VREF DAC 304 and LDO voltage regulator 307, the voltage provided to the reference sensor 121 may be accurately driven to a desired value for characterization. Moreover, the circuitry may be capable of driving the voltages within a wide range to correspond to the various voltages used on the IC. For example, one embodiment may drive the voltage from LDO voltage regulator 307 from a value of 0.5 volts to 1.1 volts, with a precision of 3.25 mV. However, it is noted that these values are exemplary, and are not intended to be restrictive with respect to the scope of this disclosure. The voltage output from LDO voltage regulator 307 may also be provided to the analog process monitor (APM) 125, which in turn is coupled to an input of multiplexer 329. A representation of the voltage output for the LDO voltage regulator 307 may be conveyed from APM 125 to its respectively coupled input of multiplexer 329. The output of multiplexer 329 is coupled to a precision analog-to-digital converter (ADC) 311. In this particular embodiment, ADC 311 is a sigma-delta (or ΣΔ ADC), although other types of high precision ADC's may be used if desired. In general, the ADC used may be a low speed, high precision ADC. Another input of multiplexer 329 is coupled to analog bus and may receive analog test signals from sources external to reference cell 300. The source may be on the same IC, or may be from circuitry external thereto. The analog test signals received through the analog bus may include information indicative of characteristics of aging of the IC, process, device characteristics, and so forth. Accordingly, this may effectively make MCC 105 a hub for receiving raw, analog data from a number of different sources and for providing corresponding digital data for further processing and/or analysis. This may enable extensive debug and testing to be performed on the IC (or external circuits that provide information through the analog bus).

The precision ADC 311 may convert any of the signals received by the multiplexer into a digital format, and output them to a destination external to the metrology golden reference center. The destination may be on chip (e.g., service processor 111, as shown in FIG. 1), off chip (e.g., ATE), or both.

Reference cell 300 also includes a temperature front end (TFE) circuit 309. TFE circuit 309 is an analog circuit configured to generate highly accurate temperature measurements. The topology shown in this example includes a current source that may vary its output with temperature, and a diode. In practice though, any type of circuitry capable of generating precision temperature readings may fall within the scope of this disclosure. The readings generated by TFE circuit 309 may be input into the precision ADC 311, via multiplexer 329, and converted to a digital format. The resulting data may be correlated to the temperature data obtained by the reference sensor 121 for use in calibration and polynomial characterization thereof.

In addition to providing analog signals to the input of the ADC, the multiplexer may also provide the analog signals to an interface suitable for coupling to external equipment. For example, the analog signals output from the multiplexer may be provided to automated test equipment or other lab equipment. This may provide a useful reference and basis for comparison between the digital values output from the ADC and the corresponding analog signals from which they were produced. In this particular example, the voltage output from multiplexer 329 is provided to an external analog voltage measurement unit 323. Measurements taken by analog voltage measurement unit may be compared to those output digitally from precision ADC 311 to ascertain the accuracy of the latter.

Figure 12:
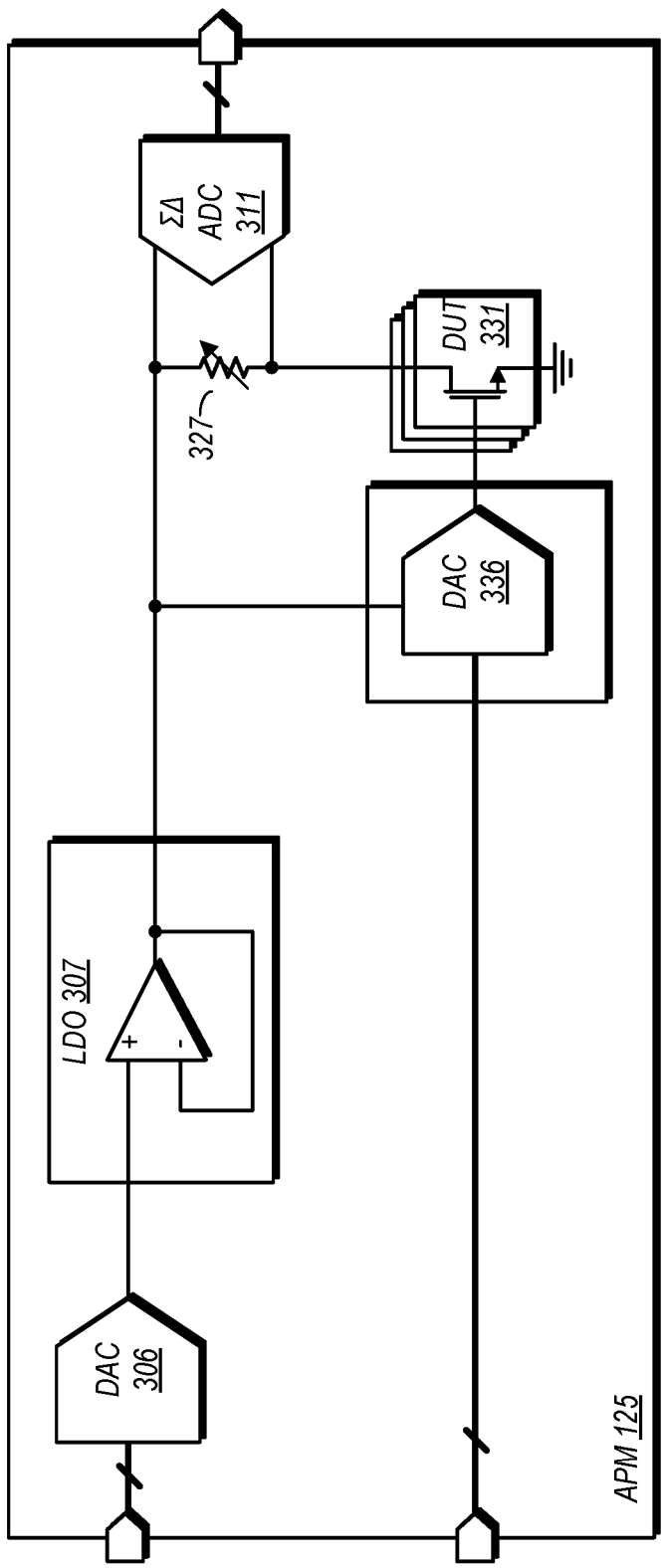
FIG. 12 is a block diagram illustrating one embodiment of an analog process monitor implemented on an IC.

FIG. 12 is a block diagram illustrating one embodiment of APM 125 as implemented on an IC. This particular embodiment also shows separate instances of a DAC 306 and an LDO voltage regulator 307 relative to the embodiment discussed above in reference to FIG. 11. However, embodiments that utilize the instances of DAC 306 and LDO voltage regulator 307 shown in the embodiment of FIG. 11 are possible and contemplated.

APM 125 also includes a separate DAC, labeled here as the DAC 336. DAC 336 may receive a digital input corresponding to a desired gate voltage to be driven onto a correspondingly coupled transistor. The transistor is shown here as the DUT (device under test) 331. The transistors selectable as DUT 331 may include virtually any (or all) of the transistors on the IC, depending on the specific embodiment. Generally speaking, a number of transistors comprising at least a subset of those implemented on the IC may be selectable as DUT 331 (for the sake of simplicity, the selection circuitry is not shown here, but its presence is implied). A particular one of the transistors may be selected as being the DUT 331, exclusive of other transistors. This arrangement may allow a precise voltage to be placed on the gate of the DUT 331, which is also shown here as coupled to a variable resistor 327. In this arrangement, the drain-source current through a transistor selected to be DUT 331 may be measured, via a voltage across the variable resistance of resistor 327. This in turn enables the measuring of a source-drain current as a function of the gate voltage. Using this value, other values pertaining to DUT 331 may be derived, such as the transconductance, output impedance, and so forth. These values may be reflected in the voltage across the variable resistor 327 (in view of the voltage applied to the gate). The voltage across the resistor is input into a precision ADC 311 (which may in one embodiment be a low speed, high resolution ΣΔ ADC as discussed above) and provided as a digital output for further processing and analysis. The arrangement shown allows APM 125 to produce analog characteristics of any transistor that may be connected thereto, with very little additional overhead. Thus, since APM 125 is configured to operate on selected individual devices, respective characteristics for that device may be obtained. This may offer a significant degree of granularity when analyzing not only the individual devices of the IC, but the overall process, voltage, and temperature variations along with other factors such as aging. Moreover, this arrangement may allow for the calibration of parameters for individual circuits on the IC, also with a high degree of granularity.

Figure 13:
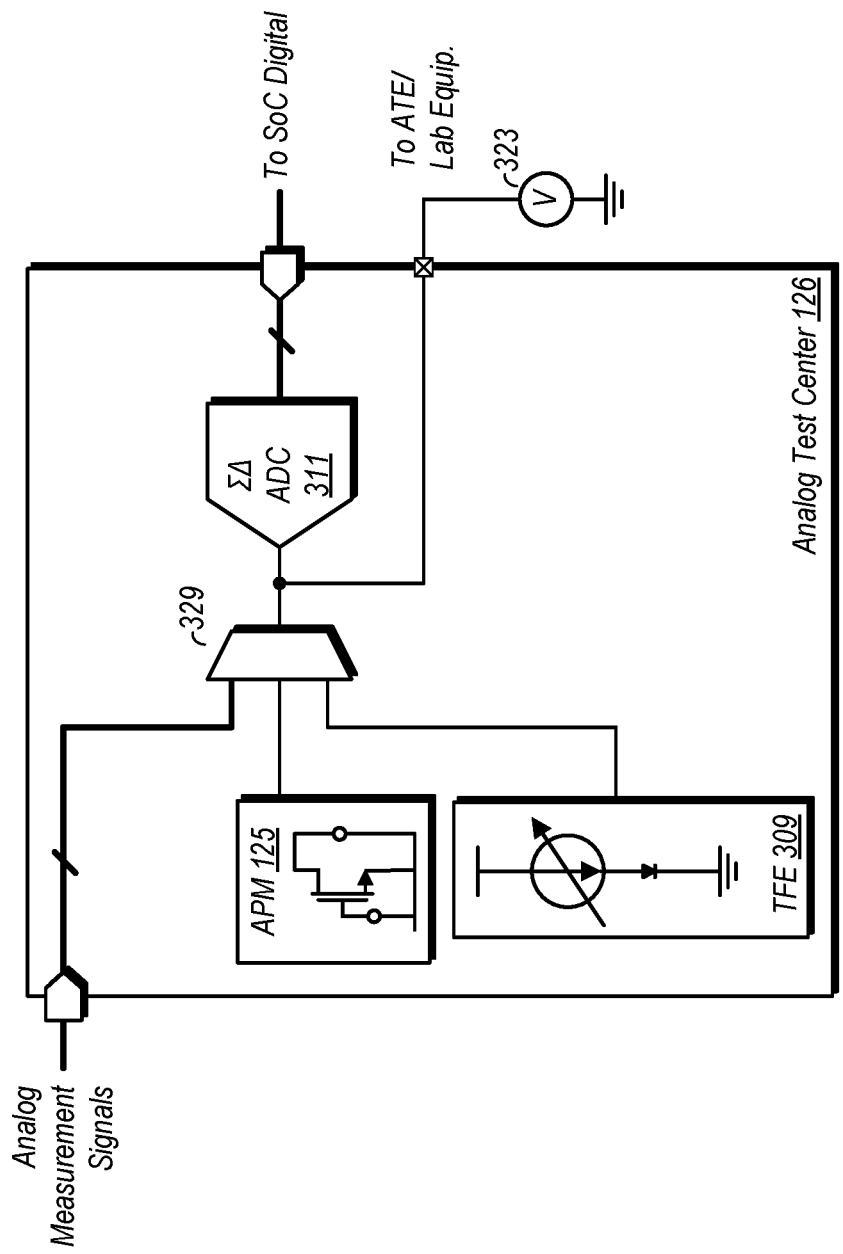
FIG. 13 is a block diagram illustrating one embodiment of an analog test center implemented on an IC.

Turning now to FIG. 13, a block diagram illustrating one embodiment of an analog test center 126 implemented on an IC is shown. In the embodiment shown, analog test center 126 includes a multiplexer 329 having three inputs. The first input is from a temperature sensing front end (TFE) circuit 309. TFE circuit 309 is a very high accuracy temperature sensor that may be implemented with any suitable circuit topology. The second input is from an embodiment of APM 125 such as that discussed above with reference to FIG. 12. The third input is from an analog bus coupled to convey analog test signals from other analog measurement system units throughout the system (which may be implemented on the same IC, on circuits external thereto, or some combination thereof). The output of the multiplexer is coupled to a low speed, high resolution ADC 311 such as the ΣΔ ADC discussed above. Thus, temperature data (from TFE circuit 309), individual transistor data (from APM 125), or other analog measurement signals may be converted into a digital format and output to other digital circuits for further processing and analysis. Due to the resolution of ADC 311 and the precision of the analog circuitry (such as the temperature sensing front end), highly accurate data may be provided. This in turn may enable better characterization of various components of the IC, including the sensors distributed throughout and individual transistors.

In general, ATC 126 may provide a hub for aggregating and routing analog signals and generating corresponding digital information. Via the APM 125 and other analog measurement signals, data may be provided from virtually any part of the IC, and in some embodiments, from circuits external thereto. Thus, the ATC 126 may effectively act as a port from which a significant amount of information regarding the operation of the chip and/or external circuits can be extracted.

Figure 14:
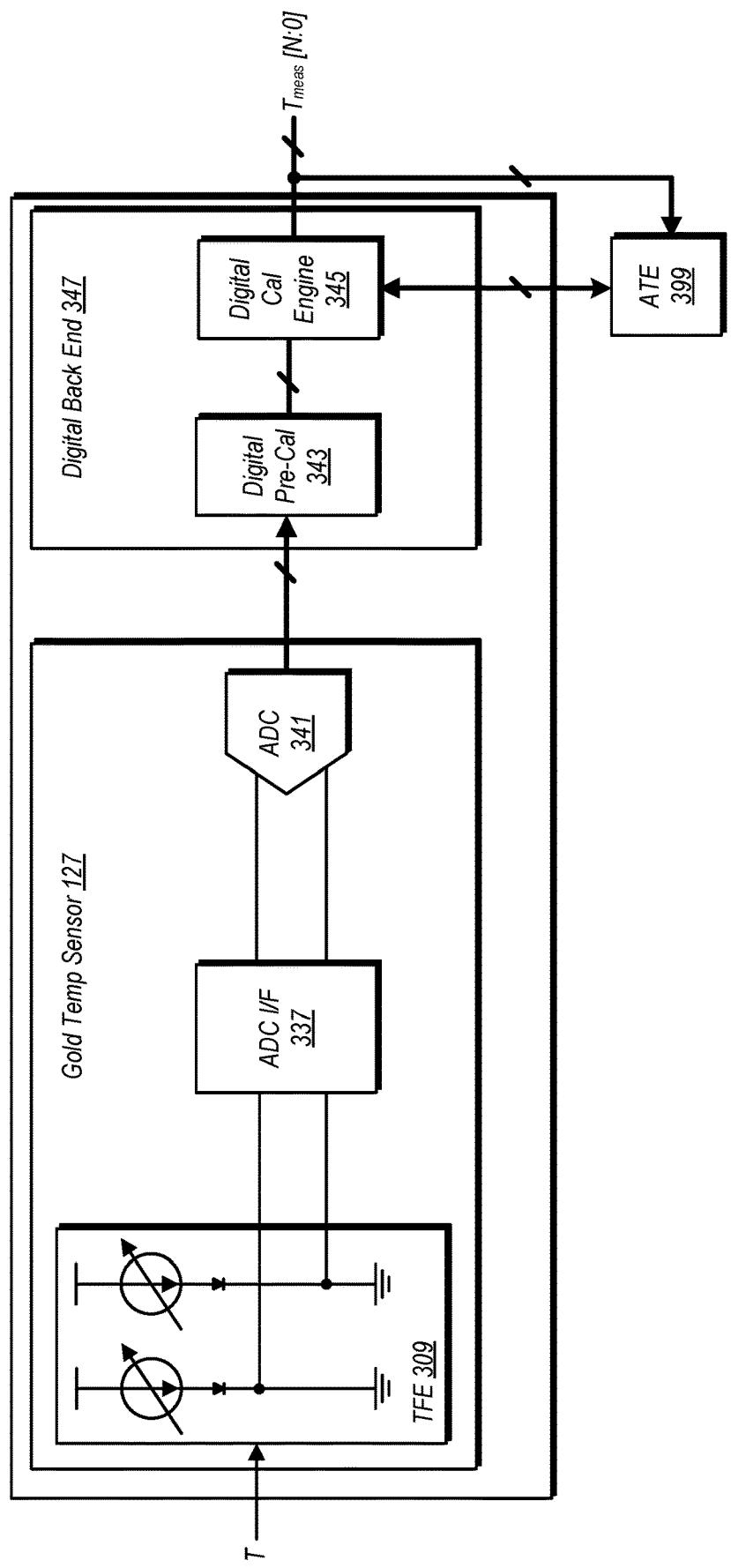
FIG. 14 is a block diagram illustrating one embodiment of temperature sensing circuitry.

FIG. 14 is a diagram illustrating one embodiment of temperature sensing circuity in a golden temperature sensor 127 used in an embodiment of MCC 105. In the embodiment shown, TFE 309 implements a circuit topology to convert a sensed temperature into an analog voltage. In this particular example, two current sources and two respectively coupled diodes are used to generate a voltage difference that corresponds to a temperature. However, this topology is exemplary, and any temperature sensing circuitry suitable for providing high accuracy readings may be implemented. The differential voltage may be provided to optional ADC interface 337, and thereafter, to an ADC 341 (or, alternatively, to ADC 311 as discussed above). The ADC 341 is arranged to convert the analog voltage difference into a digital signal that is provided to a digital back end 347. Optional digital pre-calibration circuitry 343 is shown here, and may be perform any desired pre-calibration operation in the digital domain. The output is then provided to a digital calibration engine 345 for calibrating the output temperature reading to the sensed temperature. The output from the digital calibration engine may be an N-bit output provided to an external destination, either on-chip or off chip (e.g., to automated test equipment 399). The automated test equipment 399 (or other external destination) may also provide feedback to the digital calibration engine to 345 enable a closed loop calibration process with greater accuracy. The digital representation of the sensed temperature may be used in forming a polynomial characterization that defines the generated analog voltage as a function of the temperature.

It is noted here that the division of function between the analog and digital portions of the temperature sensing operation is exemplary, and does not necessarily apply to all embodiments falling within the scope of this disclosure. In general, some embodiments may place more emphasis on the analog portion of the circuitry, while others may place more emphasis on the digital portion of the circuitry.

The various systems and circuits discussed above may provide a number of advantages in designing, characterizing, and operating circuits. In typical prior art circuit, the inherent shortcomings of analog design usually results in overdesign for compensation. This can in turn result in increased IC area consumption, power consumption, or both. The circuits discussed above may reduce or eliminate the need to overdesign by providing information that reveals the sources of the analog shortcomings. Based on the understanding of the sources of the shortcomings, measurements and corresponding corrections can be performed that obviate at least in part the need to overdesign, allowing for more efficient scaling of power and area while achieving the desired performance targets.

Figure 15:
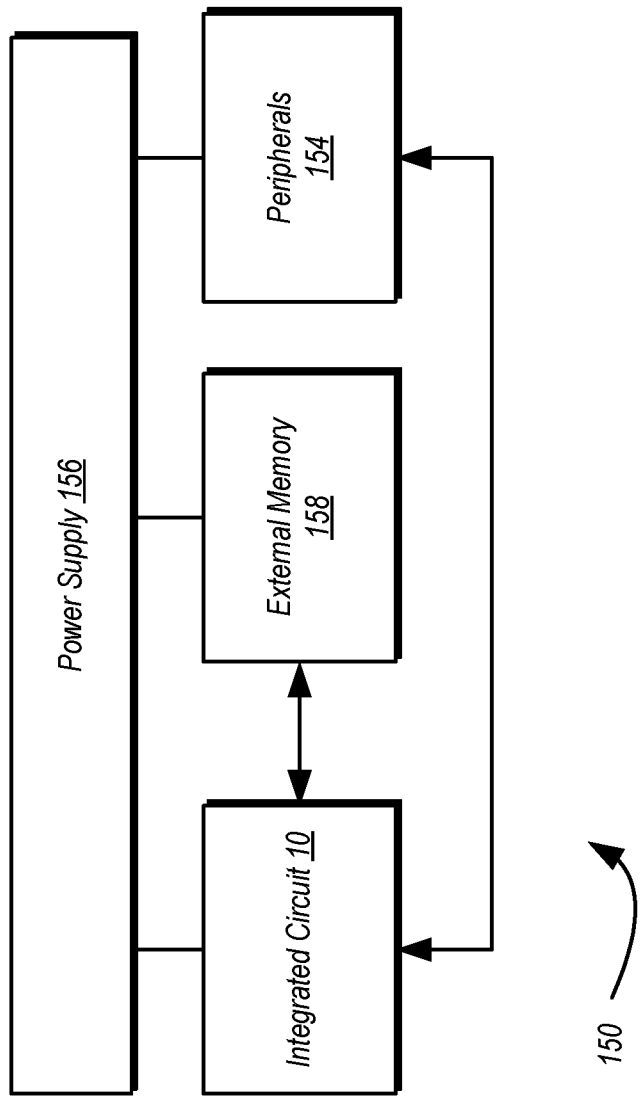
FIG. 15, is a block diagram of one embodiment of an exemplary system.

Turning next to FIG. 15, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

While it is noted that the discussion above directed to sensors 120 and reference sensor 121, it is noted that the disclosure is not intended to exclude an IC or a system from incorporating other types of sensors not discussed herein. Thus, claim language that is directed to "a plurality of sensors" is intended to cover those sensors having the same circuit topology and operating characteristics as the reference sensor, but it not intended to exclude other types of sensors that may also be implemented on the same IC or in the same system.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
a plurality of sensors implemented in corresponding ones of one or more functional circuit blocks;
a metrology control circuit including:
a reference sensor having a circuit topology identical to ones of the plurality of sensors;
a voltage generation circuit configured to provide a known voltage value within the metrology control circuit;
a temperature sensing circuit having a common set of operating conditions with the reference sensor; and
a processing circuit configured to perform correlation of frequency values obtained from the reference sensor to one or more voltages received from the voltage generation circuit and to one or more temperatures sensed by the temperature sensing circuit, and wherein the processing circuit is further configured to derive respective voltage and temperature readings from frequency information obtained from ones of the plurality of sensors based on the correlation, wherein the correlation of frequency values comprises using a characteristic polynomial indicative of a relationship between voltage, temperature, and frequency from at least one portion of the reference sensor, and wherein the processing circuit is further configured to determine temperature and voltage values of the particular sensor by applying the frequency readings to the characteristic polynomial.

2. The integrated circuit as recited in claim 1, wherein the processing circuit is configured to correlate frequency information to readings received from the voltage generation circuit and the temperature sensing circuit, wherein the frequency values are received from one or more ring oscillators of the reference sensor.

3. The integrated circuit as recited in claim 1, wherein a given one of the functional circuit blocks is coupled to a local voltage supply configured to provide a local voltage to ones of the plurality of sensors implemented in the given functional circuit block.

4. The integrated circuit as recited in claim 1, wherein the voltage generation circuit includes a digital-to-analog converter (DAC) coupled to receive a digital value representative of a desired analog voltage.

5. The integrated circuit as recited in claim 4, wherein the voltage generation circuit further includes a low dropout (LDO) voltage regulator coupled to receive an analog voltage from the DAC, wherein the LDO voltage regulator is coupled to provide the known voltage to the reference sensor.

6. The integrated circuit as recited in claim 4, wherein the DAC is coupled to receive the digital value from a multiplexer, wherein the multiplexer is coupled to receive a first digital value from a bandgap circuit implemented in the metrology control circuit, and a second digital value from a source external to the integrated circuit.

7. The integrated circuit as recited in claim 1, wherein the metrology control circuit further comprises an analog process monitoring circuit configured to determine operating characteristics of at least a subset of a plurality of transistors implemented on the integrated circuit, wherein the analog process monitoring circuit is coupled to receive an input voltage from the voltage generation circuit.

8. The integrated circuit as recited in claim 7, wherein the analog process monitoring circuit includes a digital-to-analog converter (DAC) configured to provide, to a gate terminal of a selected transistor, a desired voltage based on a digital input value.

9. The integrated circuit as recited in claim 8, wherein the analog process monitoring circuit includes a variable resistor configured to adjust a first voltage present on a terminal of the selected transistor, wherein the variable resistor is coupled to a first sigma-delta analog-to-digital converter ($\Sigma\Delta$ ADC) such that a second voltage generated across the variable resistor is input into the first $\Sigma\Delta$ ADC, the second voltage being proportional to a drain-source current through the selected transistor.

10. The integrated circuit as recited in claim 7, further comprising a multiplexer having a first input coupled to receive a first analog voltage from the analog process monitoring circuit, a second input coupled to receive a second analog voltage from a temperature front end circuit, and one or more additional inputs coupled to receive respective analog signals from one or more corresponding sources external to the metrology control circuit.

11. The integrated circuit as recited in claim 10, further comprising a second $\Sigma\Delta$ ADC circuit coupled to receive a selected analog signal from the multiplexer and to generate a corresponding digital signal representative of a characteristic of selected input of the multiplexer.

12. The integrated circuit of claim 1, wherein the processing circuit is configured to determine coefficients of the characteristic polynomial using a recursive least squares algorithm.

13. A method comprising:
receiving, at a control circuit implemented on an integrated circuit, a first plurality of frequency readings from a reference sensor;
correlating, by the control circuit, the first plurality of frequency readings with:
a plurality of temperature values received from a local temperature sensor within the control circuit; and a plurality of known voltage values received from a local voltage generation circuit within the control circuit;

receiving, by the control circuit, a second plurality of frequency readings from a particular sensor implemented in the integrated circuit outside the control circuit, wherein the reference sensor and the particular sensor have a common circuit topology; and determining, by the control circuit, a sensed voltage value and a sensed temperature value for the particular sensor based on correlated values of frequency, voltage, and temperature obtained from the correlating of the first plurality of frequency readings.

14. The method as recited in claim 13, further comprising:
a processing circuit developing a characteristic polynomial describing a relationship between voltage, temperatures, and frequency for the reference sensor the particular sensor based on the correlating; and determining the sensed voltage value and sensed temperature value by applying the second plurality of frequency readings to the polynomial.

15. The method as recited in claim 13, wherein the common circuit topology of the reference sensor and the particular sensor includes a first ring oscillator having a first circuit configuration, a second ring oscillator having a second, different configuration, and a register configured to receive and store frequency information generated by the first and second ring oscillators.

16. A system comprising:
a processing circuit coupled to receive frequency readings from a particular sensor in an integrated circuit;
a reference sensor that is a replica of the particular sensor;
a voltage generator configured to provide a known voltage to the reference sensor; and
a temperature sensor having common operating conditions with the reference sensor;
wherein the processing circuit is configured to generate correlation information by correlating frequency information from the reference sensor with:
one or more values of the known voltage from the voltage generator; and
one or more temperatures sensed by the temperature sensor; and wherein the processing circuit is configured to determine temperature and voltage values of the particular sensor using the frequency readings and the correlation information, wherein the correlation information comprises a characteristic polynomial indicative of a relationship between voltage, temperature, and frequency from at least one ring oscillator of the reference sensor, and wherein the processing circuit is further configured to determine the temperature and voltage values of the particular sensor by applying the frequency readings to the characteristic polynomial.

17. The system of claim 16, wherein the reference sensor includes a first ring oscillator having a first set of operating characteristics and a second ring oscillator having a second, different set of operating characteristics, and wherein the frequency information comprises at least one frequency generated by the first ring oscillator and at least one frequency generated by the second ring oscillator.

18. The system of claim 16, wherein the particular sensor is implemented in a given one of one or more functional circuit blocks of the integrated circuit, wherein the given one of the one or more functional circuit blocks is coupled to a local voltage supply configured to provide a local voltage to ones of one or more sensors implemented in the given one of the one or more functional circuit blocks, the one or more sensors including the particular sensor.

19. The system of claim 16, wherein the particular sensor is part of a plurality of sensors coupled via a serial testing bus that is configured to convey frequency information from the plurality of sensors to a metrology control circuit that includes the reference sensor, the voltage generator, and the temperature sensor.

20. The system of claim 16, wherein the processing circuit is configured to determine the characteristic polynomial, wherein determining the characteristic polynomial comprises the processing circuit solving a set of simultaneous equations including a first equation describing a relationship between frequency, temperature, and voltage for a first ring oscillator of the reference sensor and a second equation describing a relationship between frequency, temperature, and voltage for a second ring oscillator of the reference sensor.

* * * * *